United States Patent
Zhou et al.

(10) Patent No.: US 11,652,348 B2
(45) Date of Patent: May 16, 2023

(54) INTEGRATED CIRCUIT AND AN OPERATION METHOD THEREOF

(71) Applicants: TAIWAN SEMICONDUCTOR MANUFACTURING COMPANY, LTD., Hsinchu (TW); TSMC NANJING COMPANY LIMITED, Nanjing (CN); TSMC CHINA COMPANY LIMITED, Shanghai (CN)

(72) Inventors: Kai Zhou, Hefei (CN); Lei Pan, Shanghai (CN); Ya-Qi Ma, Shanghai (CN); Zhang-Ying Yan, Nanjing (CN)

(73) Assignees: TAIWAN SEMICONDUCTOR MANUFACTURING COMPANY, LTD., Hsinchu (TW); TSMC NANJING COMPANY LIMITED, Nanjing (CN); TSMC CHINA COMPANY LIMITED, Shanghai (CN)

( * ) Notice: Subject to any disclaimer, the term of this patent is extended or adjusted under 35 U.S.C. 154(b) by 190 days.

(21) Appl. No.: 17/143,132

(22) Filed: Jan. 6, 2021

(65) Prior Publication Data
US 2022/0149616 A1    May 12, 2022

(30) Foreign Application Priority Data
Nov. 9, 2020  (CN) .......................... 202011238431.3

(51) Int. Cl.
*H02H 9/04* (2006.01)
*H03K 17/56* (2006.01)

(52) U.S. Cl.
CPC ............. *H02H 9/046* (2013.01); *H03K 17/56* (2013.01)

(58) Field of Classification Search
CPC .. H02H 9/046; H03K 17/56; H03K 19/00315; H03K 19/00338;
(Continued)

(56) References Cited

U.S. PATENT DOCUMENTS 7,705,654 B2 * 4/2010 Rong ................. H03K 19/0963
327/427
2005/0088801 A1    4/2005 Shih et al.
(Continued)

FOREIGN PATENT DOCUMENTS

CN    103247697 A    8/2013
JP    2676807 B2    11/1997
(Continued)

*Primary Examiner* — Dharti H Patel
(74) *Attorney, Agent, or Firm* — Maschoff Brennan

(57) ABSTRACT

An integrated circuit includes a control circuit, a first voltage generation circuit, and a second voltage generation circuit. The control circuit is coupled between a first voltage terminal and a first node, and generates an initiation voltage at the first node. The first voltage generation circuit and the second voltage generation circuit are coupled to a first capacitive unit at the first node and coupled to a second capacitive unit at a second node. The first voltage generation circuit generates, in response to the initiation voltage at the first node, a first control signal based on a first supply voltage to the second voltage generation circuit. The second voltage generation circuit generates, in response to the first control signal received from the first voltage generation circuit, a second control signal to the first node, based on a second supply voltage.

20 Claims, 16 Drawing Sheets

(58) Field of Classification Search
CPC ... H03K 19/017545; H03K 19/017572; H03K 19/018557; H01L 27/0266
USPC .......................................................... 361/56
See application file for complete search history.

(56) References Cited

U.S. PATENT DOCUMENTS

| | | |
|---|---|---|
| 2005/0269599 A1 | 12/2005 | Huang et al. |
| 2007/0132030 A1 | 6/2007 | Chen |
| 2007/0249166 A1 | 10/2007 | Pelella |
| 2009/0295470 A1* | 12/2009 | Rong ................. H03K 19/0963 327/551 |
| 2012/0049939 A1* | 3/2012 | Maede ............... H03K 19/0185 327/537 |
| 2014/0183610 A1 | 7/2014 | Lee et al. |
| 2020/0004914 A1 | 1/2020 | Peng et al. |
| 2020/0020699 A1 | 1/2020 | Fujiwara et al. |
| 2020/0251466 A1* | 8/2020 | Stockinger .......... H01L 27/0727 |

FOREIGN PATENT DOCUMENTS

| | | | |
|---|---|---|---|
| JP | 2007273846 A | 10/2007 | |
| KR | 20200002002 A | 1/2020 | |
| KR | 20200008524 A | 1/2020 | |
| KR | 20200021413 A | 2/2020 | |
| TW | I257146 B | 6/2006 | |
| TW | 200723491 A | 6/2007 | |
| TW | I455283 B | 10/2014 | |
| TW | I536573 B | 6/2016 | |

* cited by examiner

INTEGRATED CIRCUIT AND AN OPERATION METHOD THEREOF

CROSS REFERENCE

The present application claims priority to China Application Serial Number 202011238431.3 filed on Nov. 9, 2020, which is herein incorporated by reference in its entirety.

BACKGROUND

De-coupling capacitance circuit is configured as an essential component for stabilization of power supply voltages in standard cell circuits of integrated circuit operating in high speed. Nonetheless, as the thickness of gate oxide layers in transistors of the integrated circuits develops to get thinner, the de-coupling capacitance circuit is exposed in higher risk of electrostatic discharge.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
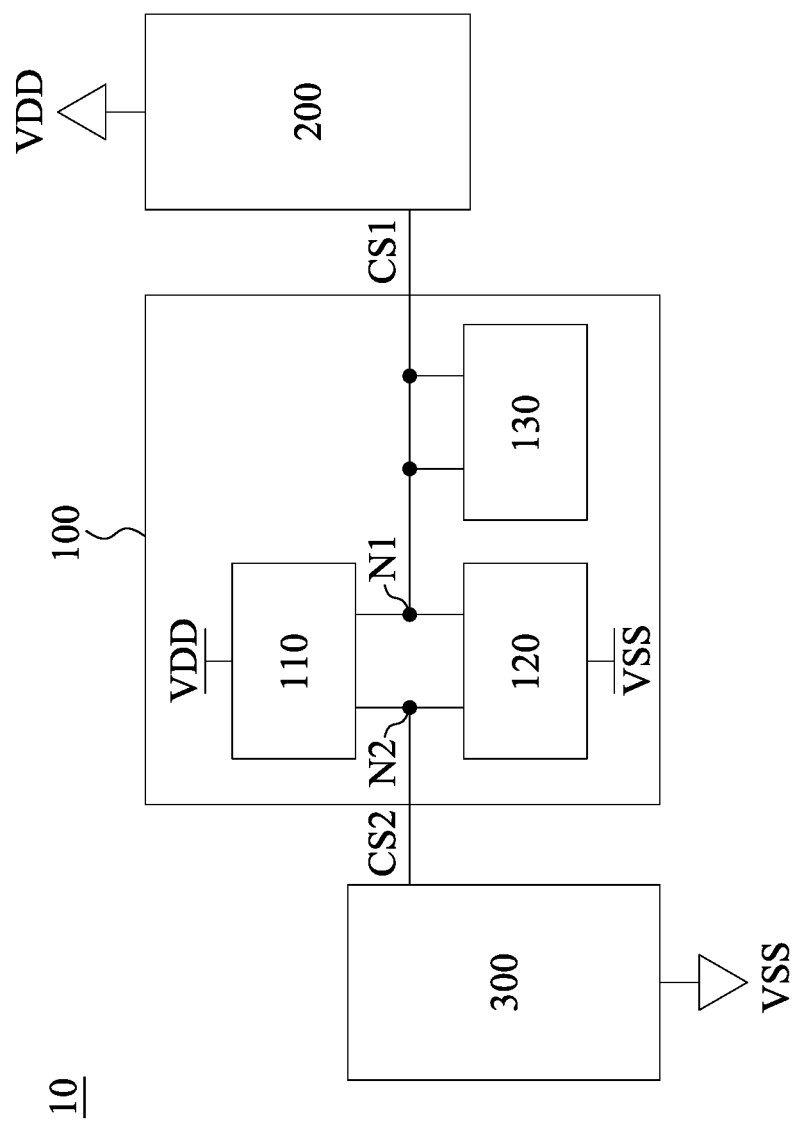
FIG. 1A is a schematic diagram of part of an integrated circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

As used herein, the terms "comprising," "including," "having," "containing," "involving," and the like are to be understood to be open-ended, i.e., to mean including but not limited to.

Reference throughout the specification to "one embodiment," "an embodiment," or "some embodiments" means that a particular feature, structure, implementation, or characteristic described in connection with the embodiment(s) is included in at least one embodiment of the present disclosure. Thus, uses of the phrases "in one embodiment" or "in an embodiment" or "in some embodiments" in various places throughout the specification are not necessarily all referring to the same embodiment. Furthermore, the particular features, structures, implementation, or characteristics may be combined in any suitable manner in one or more embodiments.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1A. FIG. 1A is a schematic diagram of part of an integrated circuit 10, in accordance with some embodiments. For illustration, the integrated circuit 10 includes a start-up circuit 100, a capacitive unit 200, and a capacitive unit 300. As shown in FIG. 1A, the start-up circuit 100 is coupled between the capacitive unit 200 and the capacitive unit 300. The capacitive unit 200 and the capacitive unit 300 are coupled to the supply voltage terminal VSS and the supply voltage terminal VDD respectively. In some embodiments, the supply voltage terminal VSS provides the supply voltage VSS (i.e., being referred to as a ground providing ground voltage,) and the supply voltage terminal VDD provides the supply voltage VDD. In some embodiments, the supply voltage VDD has a voltage level greater than the supply voltage VSS.

As shown in FIG. 1A, the start-up circuit 100 includes a voltage generation circuit 110, a voltage generation circuit 120, and a control circuit 130. The voltage generation circuit 110 and the voltage generation circuit 120 are coupled to the capacitive unit 200 at the node N1. The voltage generation circuit 110 and the voltage generation circuit 120 are coupled to the capacitive unit 300 at the node N2. The control circuit 130 is coupled between the capacitive unit 200 and the node N1. In some embodiments, the voltage generation circuit 110 is coupled to the supply voltage terminal VDD. The voltage generation circuit 120 and the control circuit 130 are coupled to the supply voltage terminal VSS. Alternatively stated, the control circuit 130 is coupled between the supply voltage terminal VSS and the voltage generation circuit 120.

In some embodiments, integrated circuit 10 is configured to operate as a de-couping circuit. Specifically, in some embodiments, the control circuit 130 is configured to generate an initiation voltage at the node N1. The voltage generation circuit 110 transmits, in response to the initiation voltage at the node N1, the supply voltage VDD from the supply voltage terminal VDD to the voltage generation circuit 120. Consequently, the voltage generation circuit 120 transmits, in response to the supply voltage VDD from the voltage generation circuit 110, the supply voltage VSS different from the supply voltage VDD to the node N1. Alternatively stated, the voltage level of the node N1 is pulled down from the initiation voltage to the supply voltage VSS by the voltage generation circuit 120. In some embodiments, the voltage generation circuit 120 is a pull down circuit.

In addition, as shown in FIG. 1A, the start-up circuit 100 is configured to output the voltage level of the node N1 as the control signal CS1 to the capacitive unit 200, and to output the voltage level of the node N2 as the control signal CS2 to the capacitive unit 300. The capacitive unit 200 and the capacitive unit 300 receive the control signal CS1 and CS2 from the start-up circuit 100 to operate separately. as mentioned above, when the voltage generation circuit 110 pulls up the voltage level of the node N2 to the supply voltage VDD and the voltage generation circuit 120 pulls down the voltage level of the node N1 to the supply voltage VSS, there is significant voltage difference between two terminals of each of the capacitive unit 200 and the capacitive unit 300. Accordingly, the capacitive unit 200 and the capacitive unit 300 have high capacitance values. The details of operations of the integrated circuit 10 will be discussed in the following paragraphs.

As mentioned above, in some embodiments, the voltage generation circuit 110 is further configured to generate based on the supply voltage VDD, in response to the initiation voltage generated by the control circuit 130, the control signal CS2 to the voltage generation circuit 120. The voltage generation circuit 120 is configured to generate based on the supply voltage VSS, in response to the control signal CS2 received from the voltage generation circuit 110, the control signal CS1 to the node N1.

Figure 1B:
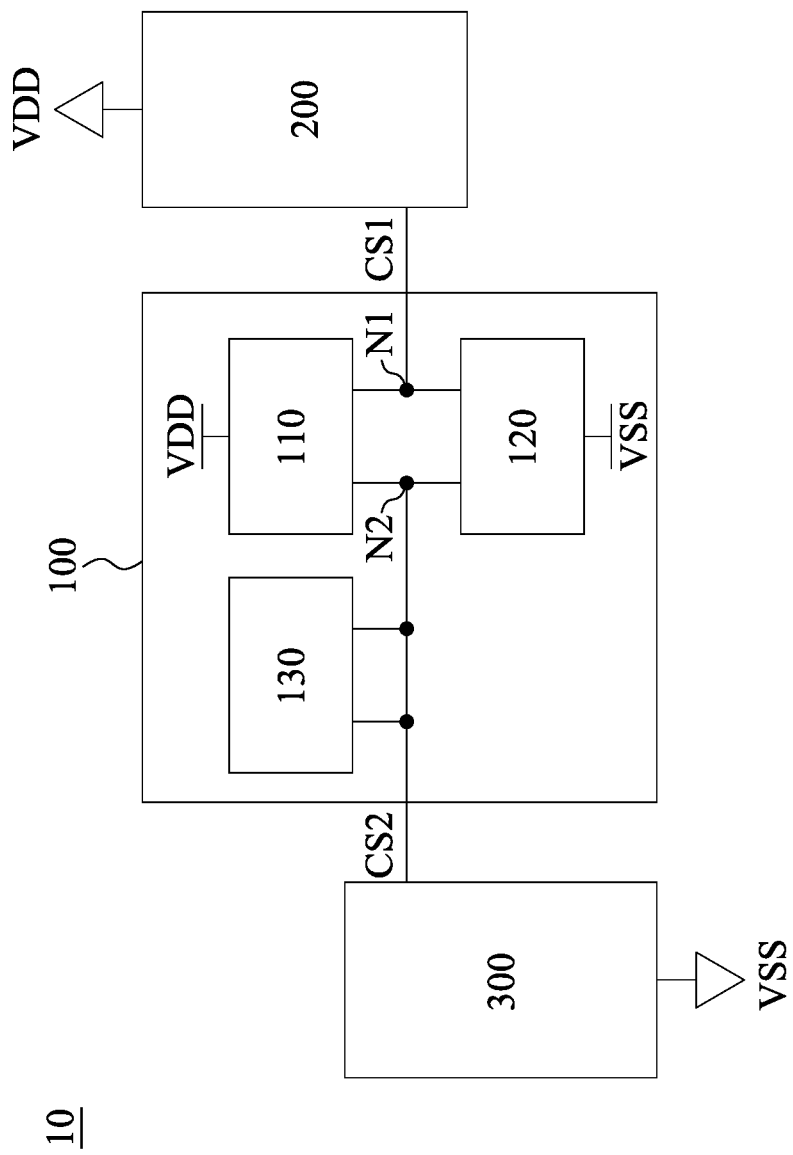
FIG. 1B is a schematic diagram of part of an integrated circuit, in accordance with various embodiments.

Reference is now made to FIG. 1B. FIG. 1B is a schematic diagram of part of the integrated circuit 10, in accordance with various embodiments. With respect to the embodiments of FIG. 1A, like elements in FIG. 1B are designated with the same reference numbers for ease of understanding. The specific operations of similar elements, which are already discussed in detail in above paragraphs, are omitted herein for the sake of brevity.

Compared with FIG. 1A, instead of the control circuit 130 being coupled between the node N1 and the capacitive unit 200, the control circuit 130 in FIG. 1B is coupled between the node N2 and the capacitive unit 300. In some embodiments, the control circuit 130 is configured to generate the initiation voltage at the node N2. The voltage generation circuit 120 transmits, in response to the initiation voltage at the node N2, the supply voltage VSS from the supply voltage terminal VSS to the voltage generation circuit 110. Consequently, the voltage generation circuit 110 transmits, in response to the supply voltage VSS from the voltage generation circuit 120, the supply voltage VSS different from the supply voltage VDD to the node N2. Alternatively stated, the voltage level of the node N2 is pulled up from the initiation voltage to the supply voltage VDD by the voltage generation circuit 110. In some embodiments, the voltage generation circuit 110 is a pull up circuit.

Figure 2:
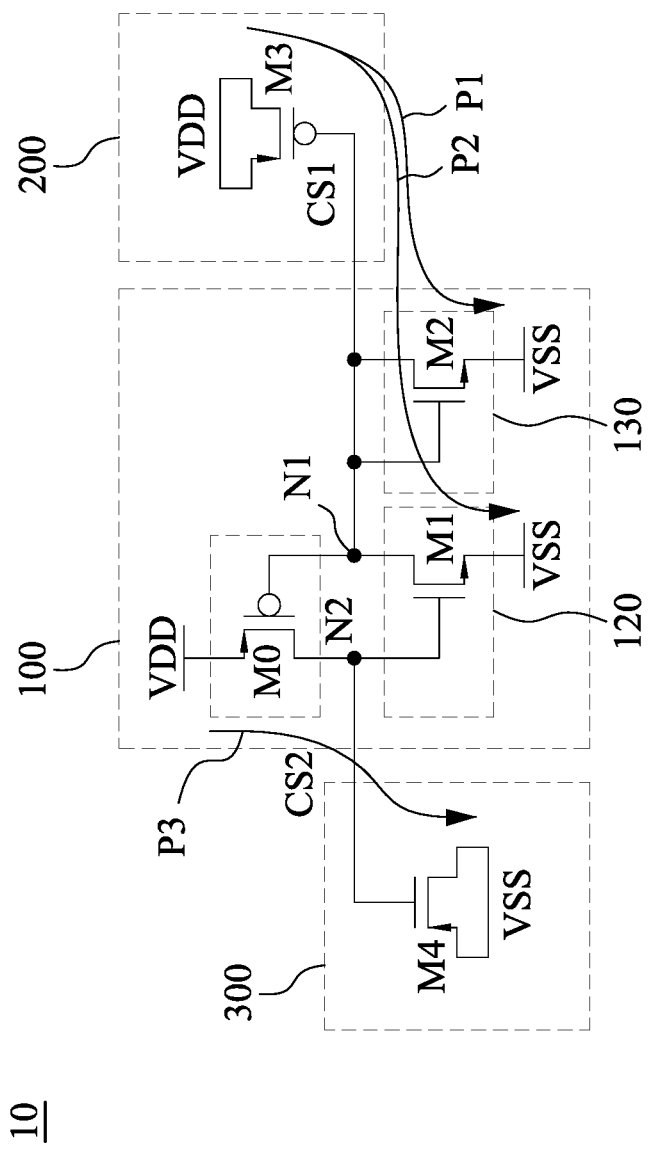
FIG. 2 is detailed schematic diagram corresponding to the integrated circuit in FIG. 1A, in accordance with some embodiments.

Reference is now made to FIG. 2. FIG. 2 is detailed schematic diagram corresponding to the integrated circuit 10 in FIG. 1A, in accordance with some embodiments. As shown in FIG. 2, the voltage generation circuit 110 in the start-up circuit 100 includes a P-type transistor M0. The voltage generation circuit 120 includes an N-type transistor M1. The control circuit 130 includes an N-type transistor M2. In some embodiments, the transistors M0-M2 are implemented by metal-oxide-semiconductor field-effect transistors (MOSFET). A gate of the transistor M0 is coupled to the node N1, a source of the transistor M0 is coupled to the supply voltage VDD, and the source of the transistor M0 is coupled to the node N2. A gate of the transistor M1 is coupled to the node N2, a source of the transistor M1 is coupled to the supply voltage VSS, and a drain of the transistor M1 is coupled to the node N1. A gate and a source of the transistor M2 are coupled to the node N1, and a source of the transistor M2 is coupled to the supply voltage VSS.

The capacitive unit 200 includes a P-type transistor M3 and the capacitive unit 300 includes an N-type transistor M4. A gate of the transistor M3 is coupled the transistors M0-M2 at the node N1, and a source and a drain of the transistor M3 and the supply voltage terminal VDD are coupled with each other. A gate of the transistor M4 and the transistor M0-M2 are coupled at the node N2, and a source and a drain of the transistor M4 and the supply voltage terminal VSS are coupled with each other.

In some embodiments, in operation, the transistor M2 operates as a diode. Specifically, in an initial stage, the transistor M2 generates at the node N1 the initiation voltage equal a threshold voltage of the transistor M2. The initiation voltage is a low voltage level with respect to the supply voltage VDD. Accordingly, the control signal CS1 having the voltage level of the node N1 is referred to as having a logic value 0. Consequently, the transistor M0 is turned on in response to the control signal CS1 which has the logic value 0 (i.e., the voltage level of the node N1) and is received at the gate of the transistor M0, and the voltage level of the node N2 is adjusted based on the supply voltage VDD. Correspondingly, the voltage level of the node N2 is the supply voltage VDD, the control signal CS2 having the voltage level of the node N2 is referred to as having a logic value 1. The transistor M1 is turned on in response to the control signal CS2 which has the logic value 1 (i.e., the voltage level of the node N2) and is received at the gate of the transistor M1, and the voltage level of the node N1 is adjusted based on the supply voltage VSS. Accordingly, the voltage level of the node N1 is pulled down from the initiation voltage, equal the threshold voltage of the transistor M2, to the supply voltage VSS. In some embodiments, the supply voltage terminal VSS is a ground terminal, and the voltage level of the node N1 is the voltage level of the ground.

Based on the discussions above, when the control signal CS1 has the logic value 0, the transistor M3 is turned on. When the control signal CS2 has the logic value 1, the transistor M4 is turned on. In the meanwhile, because the voltage generation circuit 110 and the voltage generation circuit 120 provide stable voltages to the nodes N1 and N2, the transistor M3 and the transistor M4 have steady gate clamp voltages, occupy meager areas and being de-coupling capacitors with great capacitance.

As shown in FIG. 2, in some embodiments, the integrated circuit 10 is in an ESD positive-to-VSS mode (i.e., ESD PS mode), and an ESD current between the supply voltage terminal VDD and the supply voltage terminal VSS is discharged by three electrostatic discharge paths P1-P3.

Specifically, the control circuit 130 including the transistor M2 and the capacitive unit 200 including the transistor M3 are configured as the electrostatic discharge path P1. A first portion of the ESD current between the supply voltage terminal VDD and the supply voltage terminal VSS flows out from the drain and the source of the capacitive unit 200 through the gate (i.e., being referred to as the gate oxide layer) thereof, the node N1, the drain and the source of the transistor M2 to the supply voltage terminal VSS.

In addition, the voltage generation circuit 120 including the transistor M1 and the capacitive unit 200 including the transistor M3 are configured as the electrostatic discharge path P2. A second portion of the ESD current between the supply voltage terminal VDD and the supply voltage terminal VSS flows out from the drain and the source of the capacitive unit 200 to the supply voltage terminal VSS through the gate (i.e., being referred to as the gate oxide layer) thereof, the node N1, the drain and the source of the transistor M1.

Moreover, the voltage generation circuit 110 including the transistor M0 and the capacitive unit 300 including the transistor M4 are configured as the electrostatic discharge path P3. A third portion of the ESD current between the supply voltage terminal VDD and the supply voltage terminal VSS flows out from the drain and the source of the transistor M0, through the gate (i.e., being referred to as the gate oxide layer) of the capacitive unit 300 and the drain and the source of the capacitive unit 300 to the supply voltage terminal VSS.

In some approaches, gates of elements, similar to the capacitive units 200 and 300, in a de-coupling circuit are coupled directly. When a gate oxide layer has a tendency to get thinner and thinner, a breakdown voltage of a transistor consisting of a capacitive unit declines. Therefore, in those approaches, the de-coupling circuit tends to be struck vulnerably by the ESD current and/or be broken down. On the contrary, with the configurations of FIGS. 1A-2, the gates of the capacitive units 200 and 300 are firstly coupled to the start-up circuit 100 which includes the nodes N1 and N2 of an inner network. Accordingly, it avoid the gate oxide layer from being broken down. In the meanwhile, with the electrostatic discharge paths consisted of the voltage generation circuits 110-120 and the control circuit 130, the ability of the integrated circuit for ESD protection is enhanced. In some embodiments of the present disclosure, the breakdown voltage as a whole surges around 30% to around 50%.

In further comparison, in some approaches, gate voltages of the elements, similar to the capacitive units 200 and 300 are undetermined, and are charged slowly by leakage currents in a relevant network. In such arrangements, it takes a period of time to initiate the circuit. Compared with the present disclosure, by the determined initiation voltage (i.e., a threshold voltage) provided by the control circuit 130, the voltage generation circuits 110-120 respond rapidly and generate voltages (having certain logic states) at the nodes N1-N2. Accordingly, compared with some approaches, the circuit, in one of the embodiments of the present disclosure act quicker than one in some approaches, and no extra charging time is required. The start speed of the integrated circuit in one of the embodiments of the present disclosure is around 20% faster than that of some approaches.

In addition, in some other approaches, the circuit can only utilize P-type transistors as capacitive units, and extra circuit is needed for using N-type transistors as capacitive units. At the same time, the gate voltages of the elements, similar to the capacitive units 200 and 300 are undetermined, and accordingly, significant area is required for increasing the capacitance values of the capacitive units in some approaches. Therefore, the integrated circuit suffers from the area penalty. However, the configurations of the present disclosure include P-type transistors and N-type transistors for capacitive units, and steady gate voltages are provided for the capacitive units. Compared with some approaches, the present disclosure provides greater capacitance values in a smaller area.

The configurations of FIGS. 1A-2 are given for illustrative purposes. Various implements are within the contemplated scope of the present disclosure. For example, in some embodiments, the integrated circuit 10 is in an ESD negative-to-VDD mode (ESD ND mode), the ESD current between the supply voltage terminal VDD and the supply voltage terminal VSS is also discharge in the aforementioned electrostatic discharge path P1-P3. The flowing direction of the ESD current in the ESD ND mode is contrary to that in the PS mode, while other configurations are similar. Accordingly, the repetitious descriptions are omitted herein.

Figure 3:
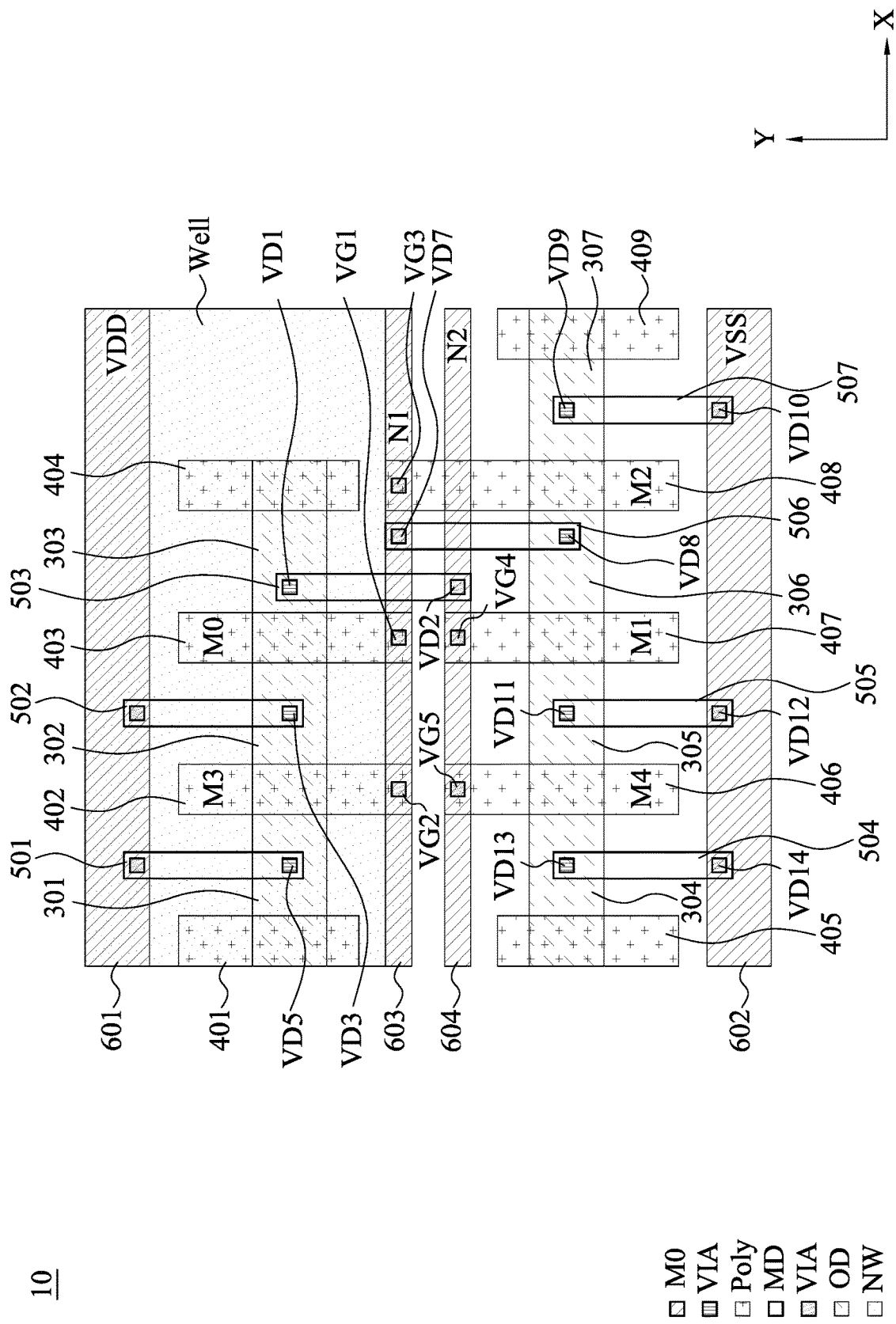
FIG. 3 is a layout diagram corresponding to the integrated circuit in FIG. 1A, in accordance with some embodiments.

Reference is now made to FIG. 3. FIG. 3 is a layout diagram corresponding to the integrated circuit 10 in FIG. 1A, in accordance with some embodiments. With respect to the embodiments of FIGS. 1A-2, like elements in FIG. 3 are designated with the same reference numbers for ease of understanding.

As shown in FIG. 3, the integrated circuit 10 includes active regions (i.e., oxide device) 301-307, gates (i.e., Poly) 401-409, conductive segments (i.e., metal on diffusion, MD) 501-507, conductive lines (i.e., metal zero layer, M0) 601-604 and vias VD1-VD14, VG1-VG5. In some embodiments, the active region 301-307 are arranged in a first layer, the gates 401-409 and the conductive segments 501-507 are arranged in a second layer above the first layer. The conductive lines 601-604 are arranged in a third layer above the second layer. The vias VD1-VD14 are arranged between the first layer and the second layer or between the second layer and the third layer. The vias VG1-VG5 are arranged between the second layer and the third layer.

In some embodiments, the gate 402 corresponds to the gate of the transistor M3, the conductive segment 501 corresponds to the drain/source of the transistor M3, and the conductive segment 502 corresponds to the source/drain of the transistor M3 and the source of the transistor M0. The gate 403 corresponds to the gate of the transistor M0, the conductive segment 503 corresponds to the drain of the transistor M0. The gate 406 corresponds to the gate of the transistor M4, the conductive segment 504 corresponds to the drain/source of the transistor M4, and the conductive segment 505 corresponds to the source/drain of the transistor M4 and the source of the transistor M1. The gate 407 corresponds to the gate of the transistor M1, the conductive segment 506 corresponds to the drain of the transistor M1 and the drain of the transistor M2. The gate 408 corresponds to the gate of the transistor M2, the conductive segment 507 corresponds to the source of the transistor M2. In some embodiments, the gates 401, 404, 405, and 409 are configured as dummy gates, in which in some embodiments, "dummy gate" are referred to as being not electrically connected as the gate for MOS devices, having no function in the circuit.

For illustration, as shown in FIG. 3, the active regions 301-307 extend in x direction. In some embodiments, the active regions 301-303 are included in an active area arranged in an N-type well (NW), in which the N-type is arranged on a substrate (not shown). The active regions 304-307 are arranged on the substrate or in another active area arranged in a P-type well.

The gates 401-409 extend in y direction. The gates 401-404 are separated from each other in x direction, and the gates 405-409 are separated from each other in x direction. As shown in FIG. 3, the gate 402 is arranged between the active regions 301 and 302. The gate 403 is arranged between the active region 302 and 303. The gate 406 is arranged between the active region 304 and 305. The gate 407 is arranged between the active region 305 and 306. The gate 408 is arranged between the active region 306 and 307. In some embodiments, the gates 401-404 in a layout diagram crosses over the active area including the active regions 301-303, and the gates 405-409 in the layout diagram crosses the active area including the active regions 304-307.

The conductive segments 501-507 extend in y direction. For illustration, the conductive segment 501 crosses the active region 301, the conductive segment 502 crosses the active region 302, the conductive segment 503 crosses the active region 303, the conductive segment 504 crosses the active region 304, the conductive segment 505 crosses the active region 305, the conductive segment 506 crosses the active region 306 and the conductive segment 507 crosses the active region 307.

The conductive lines 601-604 extend in x direction, and are separated from each other in y direction. In some embodiments, the conductive lines 601 and 602 are configured to transmit the supply voltages VDD and VSS, respectively, to the integrated circuit 10. The conductive line 603 corresponds to the node N1. The conductive line 604 corresponds to the node N2.

Regarding the connection relationship, the active region 301 is coupled to the conductive segment 501 by the via VD5, and the conductive segment 501 is coupled to the conductive line 601 through the via VD6 to receive the supply voltage VDD. Similarly, the active region 302 is coupled to the conductive segment 502 through the via VD3, and the conductive segment 502 is coupled to the conductive line 601 through the via VD4 to receive the supply voltage VDD. The gate 402 is coupled to the conductive line 603 through the via VG2. As mentioned above, the drain and the source of the transistor M3 and the drain of the transistor M0 are coupled to the supply voltage terminal VDD, and the gate of the transistor M3 is coupled to the node N1.

The gate 403 is coupled to the conductive line 603 through the via VG1. The active region 303 is coupled to the conductive segment 503 through the via VD1, and the conductive segment 503 is coupled to the conductive line 604 through the via VD2. As mentioned above, the drain of the transistor M0 is coupled to the node N2 and the gate of the transistor M0 is coupled to the node N1.

The active region 304 is coupled to the conductive segment 504 through the via VD13, and the conductive segment 504 is coupled to the conductive line 602 through the via VD14 to receive the supply voltage VSS. Similarly, the active region 305 is coupled to the conductive segment 505 through the via VD11, and the conductive segment 505 is coupled to the conductive line 602 through the via VD12 to receive the supply voltage VSS. The gate 406 is coupled to the conductive line 604 through the via VG5. As mentioned above, the drain and the source of the transistor M4 and the source of the transistor M1 are coupled to the supply voltage terminal VSS, and the gate of the transistor M4 is coupled to the node N2.

The gate 407 is coupled to the conductive line 604 through the via VG4. The active region 306 is coupled to the conductive segment 506 through the via VD8, and the conductive segment 506 is coupled to the conductive line 603 through the via VD7. As mentioned above, the source of the transistor M1 is coupled to the node N1 and the gate of the transistor M1 is coupled to the node N2.

The gate 408 is coupled to the conductive line 603 through the via VG3. The active region 307 is coupled to the conductive segment 507 through the via VD9, and the conductive segment 507 is coupled to the conductive line 602 through the via VD10. As mentioned above, the gate of the transistor M2 is coupled to the node N1 and the gate of the transistor M2 is coupled to the supply voltage terminal VSS.

In some embodiments, a portion of the ESD current between the supply voltage terminal VDD and the supply voltage terminal VSS is discharged by the semiconductor structure of the transistors M1-M3 and the conductive line 603. In some alternative embodiments, another portion of the ESD current is discharged by the transistors M0, M4 and the conductive line 604.

The configurations of FIG. 3 are given for illustrative purposes. Various implements are within the contemplated scope of the present disclosure. For example, in some embodiments, according to the actual requirement of ESD protection, at least two of the transistors M0-M4 do not share active regions.

Figure 4:
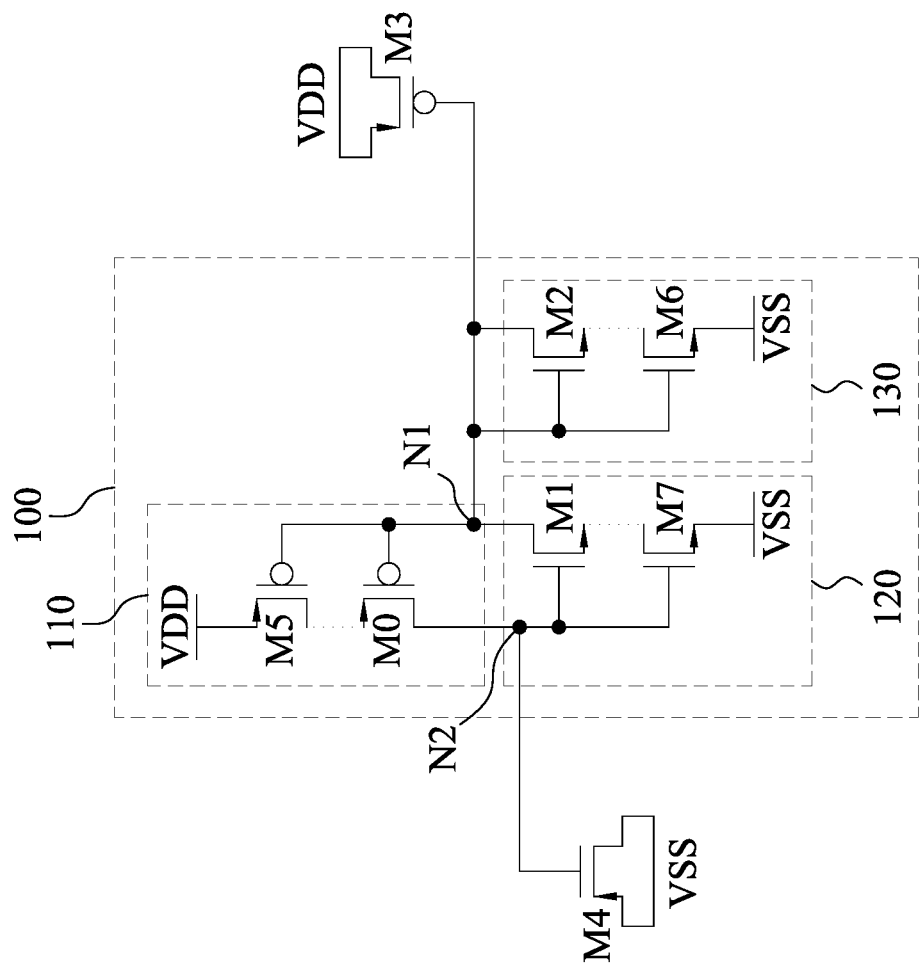
FIG. 4 is detailed schematic diagram of an integrated circuit corresponding to the integrated circuit in FIG. 1A, in accordance with various embodiments.

Reference is now made to FIG. 4. FIG. 4 is detailed schematic diagram of an integrated circuit 20 corresponding to the integrated circuit 10 in FIG. 1A, in accordance with various embodiments. In some embodiments, the integrated circuit 20 is configured with respect to, for example, the integrated circuit 10. With respect to the embodiments of FIGS. 1A-3, like elements in FIG. 4 are designated with the same reference numbers for ease of understanding.

Compared with FIG. 2, each of the voltage generation circuit 110, the voltage generation circuit 120 and the control circuit 130 in the integrated circuit 20 further includes multiple transistors coupled in series. Specifically, the voltage generation circuit 110 further includes a P-type transistor M5 coupled in series with the transistor M0. The voltage generation circuit 120 further includes an N-type transistor M5 coupled in series with the transistor M1. The control circuit 130 further includes an N-type transistor M6 coupled in series with the transistor M2.

As shown in FIG. 4, a gate of the transistor M5 and a gate of the transistor M0 coupled at the node N1. Compared with FIG. 2, instead of the source of the transistor M0 being directly coupled to the supply voltage terminal VDD, in FIG. 4 the source of the transistor M0 is coupled to and the drain of the transistor M5, and the source of the transistor M5 is coupled to the supply voltage terminal VDD. Similarly, the gate of the transistor M6 and the gate of the transistor M1 are coupled at the node N2. Compared with FIG. 2, instead of the source of the transistor M1 being directly coupled to the supply voltage terminal VSS, in FIG. 4 the source of the transistor M1 is coupled to the drain of the transistor M6, and the source of the transistor M6 is coupled to the supply voltage terminal VSS. In addition, the gate of the transistor M7 and the gate of the transistor M2 are coupled at the node N1. Compared with FIG. 2, instead of the source of the transistor M2 being directly coupled to the supply voltage terminal VSS, in FIG. 4 the source of the transistor M2 is coupled to the drain of the transistor M7, and the source of the transistor M7 is coupled to the supply voltage terminal VSS.

In some embodiments, the voltage generation circuit 110, the voltage generation circuit 120, and the control circuit 130 form as a multiple-stage circuit by including multiple transistors in order to meet the requirements of ESD protection capacity while operating the integrated circuit 20. In various embodiments, with the configurations of each one of the voltage generation circuit 110 and the voltage generation circuit 120 including two stages transistor circuit shown in FIG. 4, a break down voltage of the integrated circuit 20 increases 1.0 Volts.

The configurations of FIG. 4 are given for illustrative purposes. Various implements are within the contemplated scope of the present disclosure. For example, in some embodiments, each of the voltage generation circuit 110, the voltage generation circuit 120 and the control circuit 130 of the integrated circuit 20 includes more than two transistors coupled in series with each other.

Figure 5A:
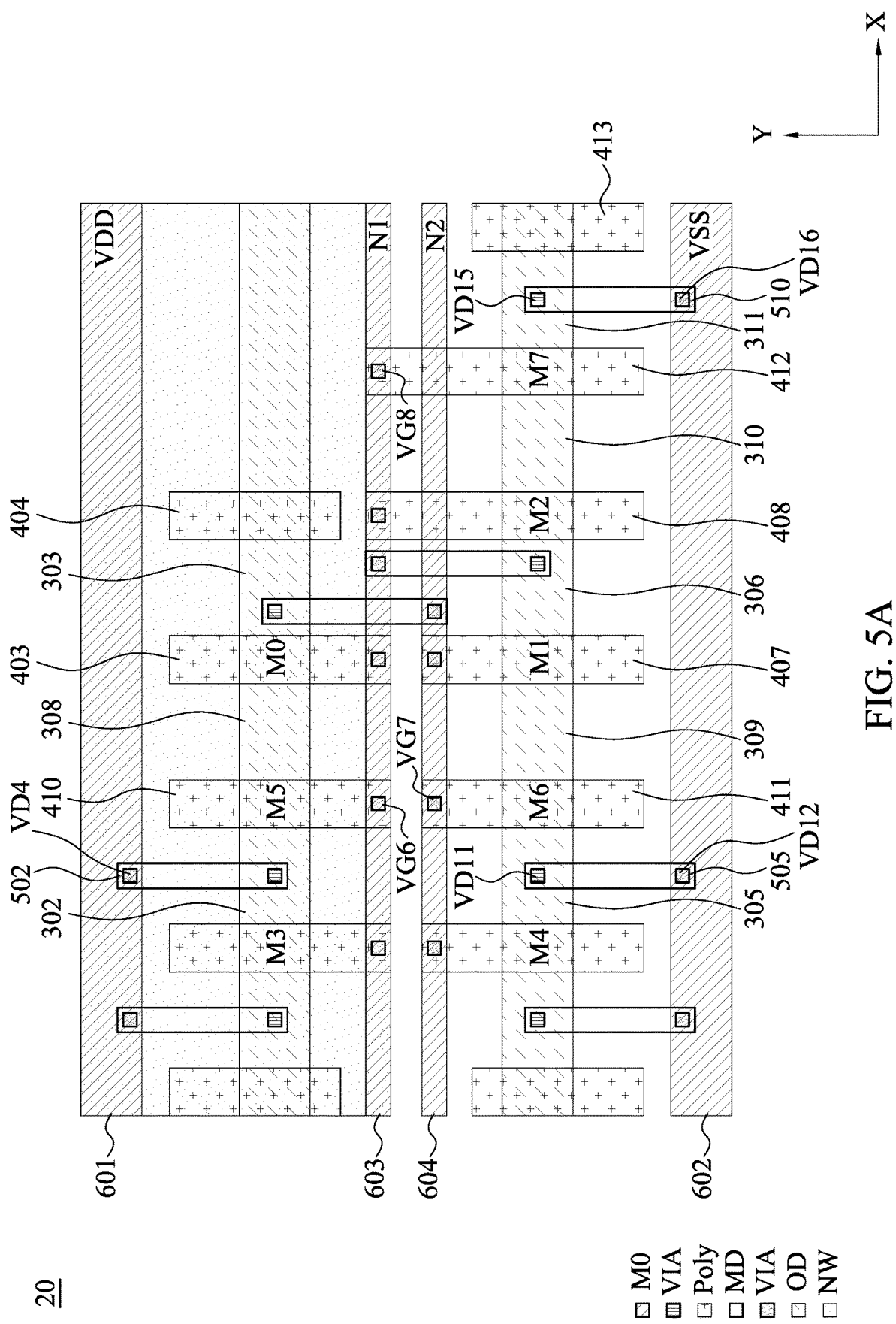
FIG. 5A is a layout diagram corresponding to the integrated circuit in FIG. 4, in accordance with some embodiments.

Reference is now made to FIG. 5A. FIG. 5A is a layout diagram corresponding to the integrated circuit 20 in FIG. 4, in accordance with some embodiments. With respect to the embodiments of FIGS. 1A-4, like elements in FIG. 5A are designated with the same reference numbers for ease of understanding.

Compared with FIG. 3, the integrated circuit 20 further includes active regions 308-311, gates 410-413, a conductive segment 510 and vias VD15-VD16. The active regions 308-311 are configured with respect to, for example, the active region 303. The gates 410-413 are configured with respect to, for example, the gate 403. In some embodiments, the gate 413 is configured as a dummy gate. The conductive segment 510 is configured with respect to, for example, the conductive segment 505. The vias VD15-VD16 are configured with respect to, for example, the via VD14.

In some embodiments, the active region 302 corresponds to the source of the transistor M5, the gate 410 corresponds to the gate of the transistor M5, and the active region 308 corresponds to the drain of the transistor M5 and the source of the transistor M0. The gate 410 is coupled to the conductive line 603 through the via VG6. Accordingly, the gate of the transistor M5 is coupled to the node N1, the source of the transistor M5 is coupled to the supply voltage terminal VDD, and the drain of the transistor M5 is coupled to the gate of the transistor M0.

The active region 305 corresponds to the source of the transistor M6, the gate 411 corresponds to the source of the transistor M6, and the active region 309 corresponds to the gate of the transistor M6 and the drain of the transistor M1. The gate 411 is coupled to the conductive line 604 through the via VG7. Accordingly, the gate of the transistor M6 is coupled to the node N2, the source of the transistor M6 is coupled to the supply voltage terminal VSS, and the drain of the transistor M6 is coupled to the gate of the transistor M1.

The active region 311 corresponds to the source of the transistor M7, the gate 412 corresponds to the gate of the transistor M7, and the active region 310 corresponds to the drain of the transistor M7 and the source of the transistor M2. The gate 412 is coupled to the conductive line 603 through the via VG8. The active region 311 is coupled to the conductive segment 510 through the via VD13, and the conductive segment 510 is coupled to the conductive line 602 through the via VD16. Accordingly, the gate of the transistor M7 is coupled to the node N1, the source of the transistor M7 is coupled to the supply voltage terminal VSS, and the drain of the transistor M7 is coupled to the source of the transistor M2.

Figure 5B:
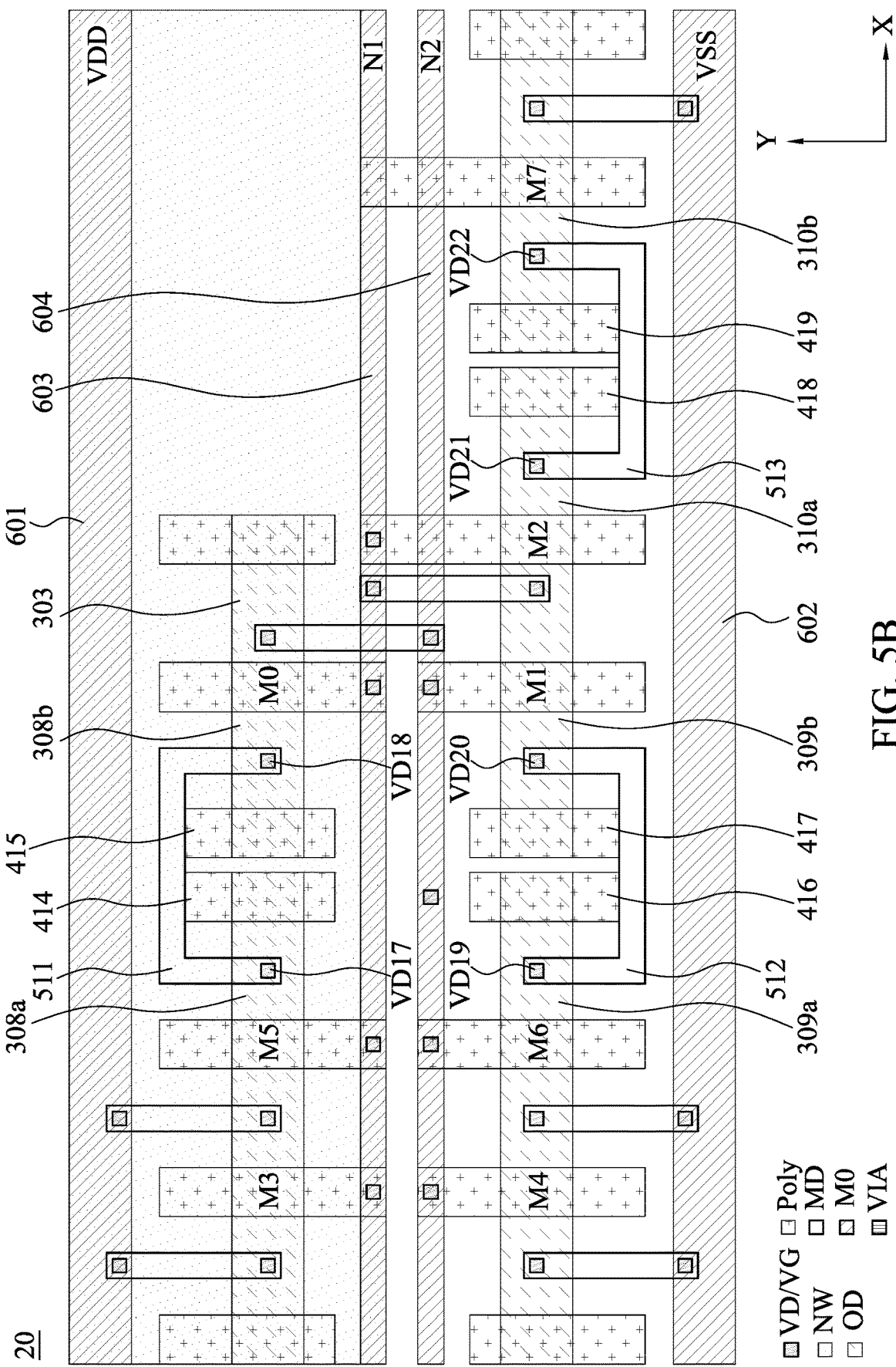
FIG. 5B is a layout diagram corresponding to the integrated circuit in FIG. 4, in accordance with various embodiments.

Reference is now made to FIG. 5B. FIG. 5B is a layout diagram corresponding to the integrated circuit 20 in FIG. 4, in accordance with various embodiments. With respect to the embodiments of FIGS. 1A-5A, like elements in FIG. 5B are designated with the same reference numbers for ease of understanding.

Compared with FIG. 5A, with regard to transistors sharing active regions, part of the active regions of the transistors in FIG. 5B are separated from each other. As shown in FIG. 5B, the integrated circuit 20 further includes active regions 308a-308b, 309a-309b, 310a-310b, gates 414-419, conductive segments 511-513 and vias VD17-22. In some embodiments, the active regions 308a-308b correspond to a first portion and a second portion of the active region 308 in FIG. 5A. The active regions 309a-309b correspond to a first portion and a second portion of the active region 309 in FIG. 5A. The active regions 310a-310b correspond to a first portion and a second portion of the active region 310 in FIG. 5A. The gates 414-419 are configured with respect to, for example, the gate 413. In some embodiments, the gates 414-419 are dummy gates. The conductive segments 511-513 are configured with respect to, for example, the conductive segment 503. The vias VD17-VD22 are configured with respect to, for example, the via VD1.

In some embodiments, the gates 414-415 are not electrically connected with the conductive segment 511. The gates 416-417 are not electrically connected with the conductive segment 512. The gates 418-419 are not electrically connected with the conductive segment 513.

In some embodiments, the active region 308a corresponds to the drain of the transistor M5, and the active region 308b corresponds to the source of the transistor M0. In addition, the active regions 308a-308b are separated from each other in x direction. Alternatively stated, the transistors M0 and M5 do not share the active region, are referred to as having structures of separated active regions (separate OD). In some embodiments, the ESD resistance performance of the integrated circuit 20 is enhanced by around 20%. In various embodiments, the occupied area of separated active regions and the ESD resistance performance are considered comprehensively in designing the integrated circuit 20.

Similarly, the active region 309a corresponds to the drain of the transistor M6, and the active region 309b corresponds to the source of the transistor M1. The active regions 309a-309b are separated from each other in x direction. Alternatively stated, the transistors M1 and M6 do not share the active region.

The active region 310a corresponds to the drain of the transistor M7, and the active region 310b corresponds to the source of the transistor M2. The active regions 310a-310b are separated from each other in x direction. Alternatively stated, the transistors M2 and M7 do not share the active region.

The configurations of FIGS. 5A-5B are given for illustrative purposes. Various implements are within the contemplated scope of the present disclosure. For example, in some embodiments, the structure design of separated active regions is adapted for all of active regions in the integrated circuit 20.

Figure 6:
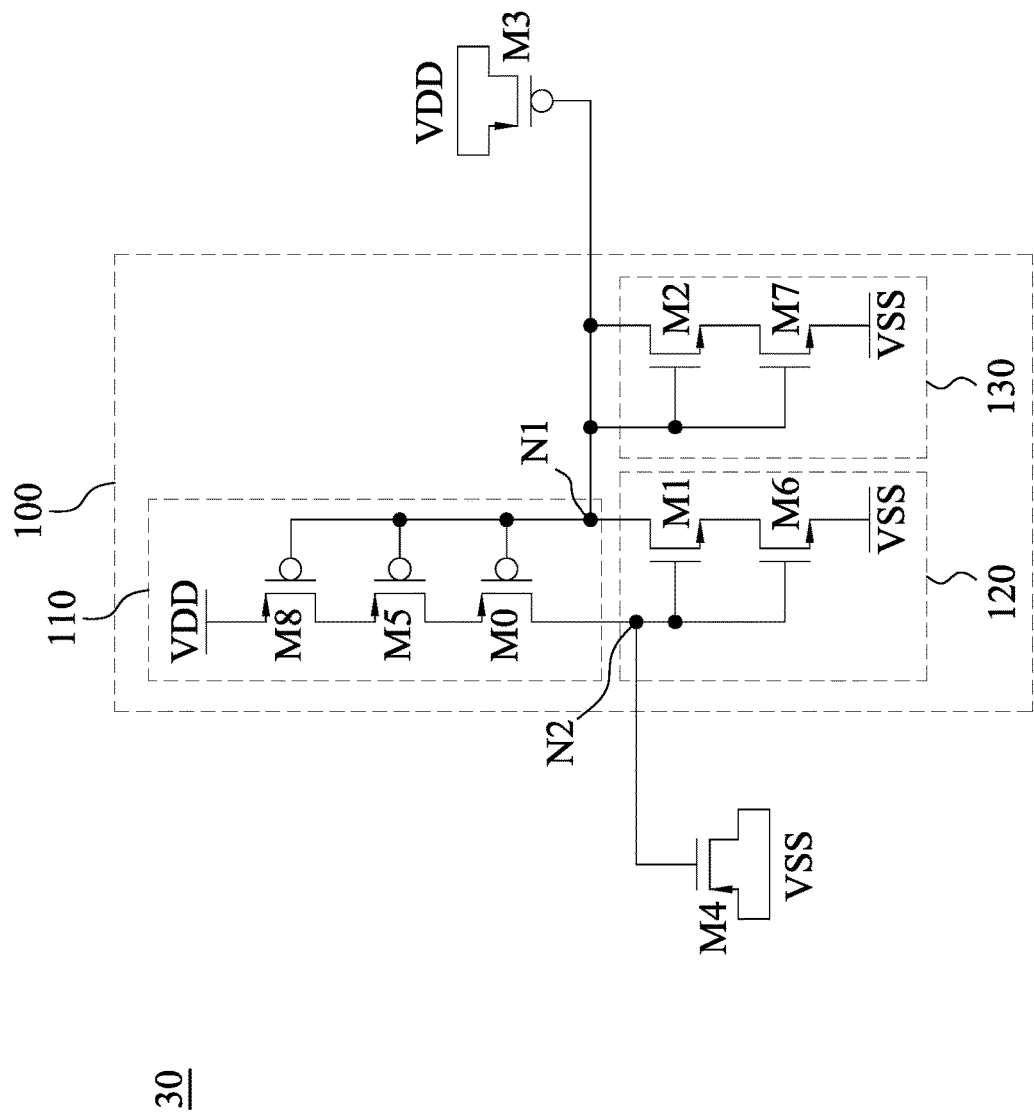
FIG. 6 is detailed schematic diagram of an integrated circuit of an integrated circuit corresponding to the integrated circuit in FIG. 1A, in accordance with various embodiments.

Reference is now made to FIG. 6. FIG. 6 is detailed schematic diagram of an integrated circuit 30 corresponding to the integrated circuit 10 in FIG. 1A, in accordance with various embodiments. With respect to the embodiments of FIGS. 1A-5B, like elements in FIG. 6 are designated with the same reference numbers for ease of understanding.

Compared with FIG. 4, the integrated circuit 30 further includes a P-type transistor M8. A drain of the transistor M8 is coupled to the source of the transistor M5, a source of the transistor M8 is coupled to the supply voltage terminal VDD, and the gate of the transistor M8 is coupled to the gates of the transistors M5 and M0 at the node N1.

In some embodiments, a number of P-type transistors in the voltage generation circuit 110 is different from a number of N-type transistors in the voltage generation circuit 120 and a number of N-type transistors in the control circuit 130. As shown in FIG. 6, the voltage generation circuit 110 includes three P-type transistors, and the voltage generation circuit 120 and the control circuit 130 includes two N-type transistors respectively.

As mentioned above, the number of P-type transistors in the voltage generation circuit 110 is different from a sum of the number of N-type transistors in the voltage generation circuit 120 and the number of N-type transistors in the control circuit 130. As shown in the embodiments of FIG. 6, the number of N-type transistors in the voltage generation circuit 120 and the control circuit 130 is greater than the number of P-type transistors in the voltage generation circuit 110. In some embodiments, due to the manufacture process and physical properties, the N-type transistors' tolerance to ESD is lower than that of the P-type transistors. Therefore, the start-up circuit 100 includes fewer P-type transistors and also meets the ESD performance requirements of the integrated circuit 30.

The configurations of FIG. 6 are given for illustrative purposes. Various implements are within the contemplated scope of the present disclosure. For example, in some embodiments, the voltage generation circuit 110 and the voltage generation circuit 120 of the integrated circuit 30 include the same quantity of transistors, for example, three N-type transistors.

Figure 7:
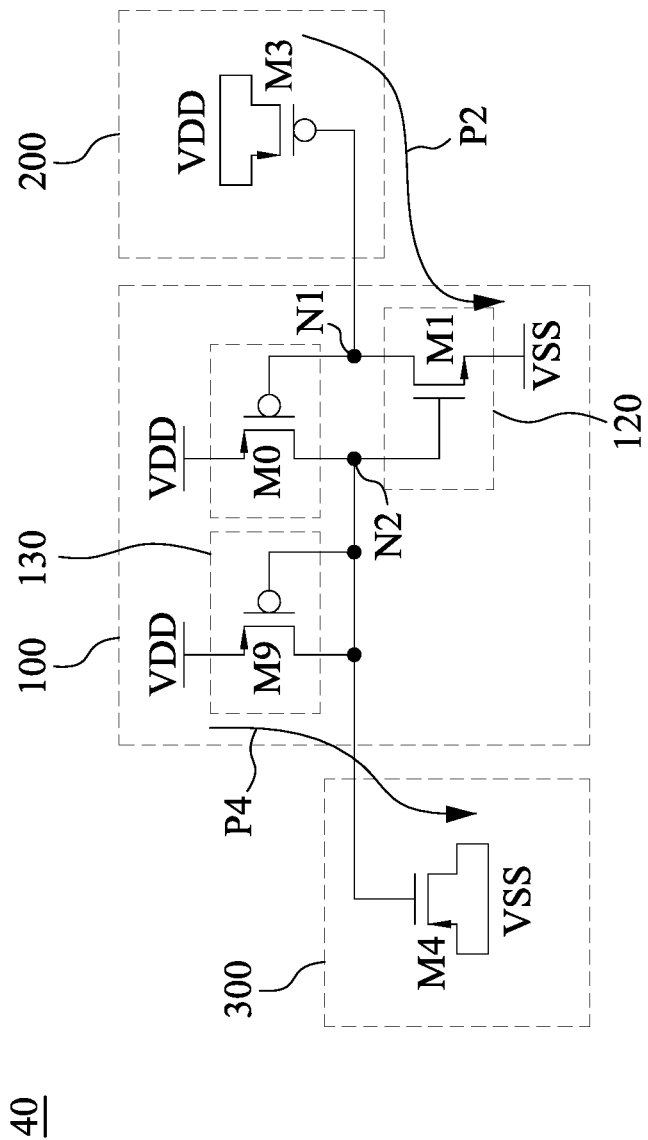
FIG. 7 is detailed schematic diagram of an integrated circuit corresponding to the integrated circuit in FIG. 1B, in accordance with various embodiments.

Reference is now made to FIG. 7. FIG. 7 is detailed schematic diagram of an integrated circuit 40 corresponding to the integrated circuit 10 in FIG. 1B, in accordance with various embodiments. With respect to the embodiments of FIGS. 1A-6, like elements in FIG. 7 are designated with the same reference numbers for ease of understanding.

As shown in FIG. 7, the control circuit 130 includes a P-type transistor M9. A gate and a drain of the transistor M9 are coupled the node N2. The source of the transistor M9 is coupled the supply voltage terminal VDD.

Compared with FIG. 2, instead of the control circuit 130 being configured to provide the initiation voltage at the node N1, in the embodiments of FIG. 7, the control circuit 130 is configured to provide the initiation voltage at the node N2. In some embodiments, in operation, the transistor M9 operates as a diode. Specifically, in the initiation stage, the transistor M9 generates the initiation voltage at the node N2, in which the initiation voltage is associated with a threshold voltage (i.e., Vth) of the transistor M9 and the supply voltage VDD, being the supply voltage VDD subtracts the threshold voltage of the transistor M9 (VDD-Vth). The initiation voltage is a high voltage level with respect to the supply voltage VSS. Accordingly, the control signal CS2 having the voltage level of the node N2 is referred to as having the logic value 1. Consequently, the transistor M1 is turned on in response to the control signal CS2 which has the logic value 1 (i.e., the voltage level of the node N2) and is received at the gate of the transistor M1, and the voltage level of the node N1 is adjusted based on the supply voltage VSS. Correspondingly, the voltage level of the node N1 is the supply voltage VSS, and the control signal CS1 having the voltage level of the node N1 is referred to as having the logic value 0. The transistor M0 is turned on in response to the control signal CS1 which has the logic value 0 (i.e., the voltage level of the node N1) and is received at the gate of the transistor M0, and the voltage level of the node N2 is adjusted based on the supply voltage VDD. Accordingly, the voltage level of the node N2 is pulled up from the initiation voltage, equal the voltage of VDD-Vth, to the supply voltage VDD. The configurations of the integrated circuit 40 of FIG. 7 are similar to the integrated circuit 10. Hence, the repetitious descriptions are omitted here.

In addition, the ESD current between the supply voltage terminal VDD and the supply voltage terminal VSS is further discharged by the electrostatic discharge path P4. Specifically, the control circuit 130 including the transistor M9 and the capacitive unit 300 including the transistor M4 are configured as the electrostatic discharge path P4. Part of the ESD current between the supply voltage terminal VDD and the supply voltage terminal VSS flows out from the supply voltage terminal VDD to the gate (being referred as to the gate oxide layer) of the capacitive unit 300 through the source and the drain of the transistor M9 and the node N2, and further flows to the supply voltage terminal VSS through the source and the drain of the capacitive unit 300.

The configurations of FIG. 7 are given for illustrative purposes. Various implements are within the contemplated scope of the present disclosure. For example, in some embodiments, the voltage generation circuit 120 includes multiple N-type transistors, for example, more than two N-type transistors.

Figure 8:
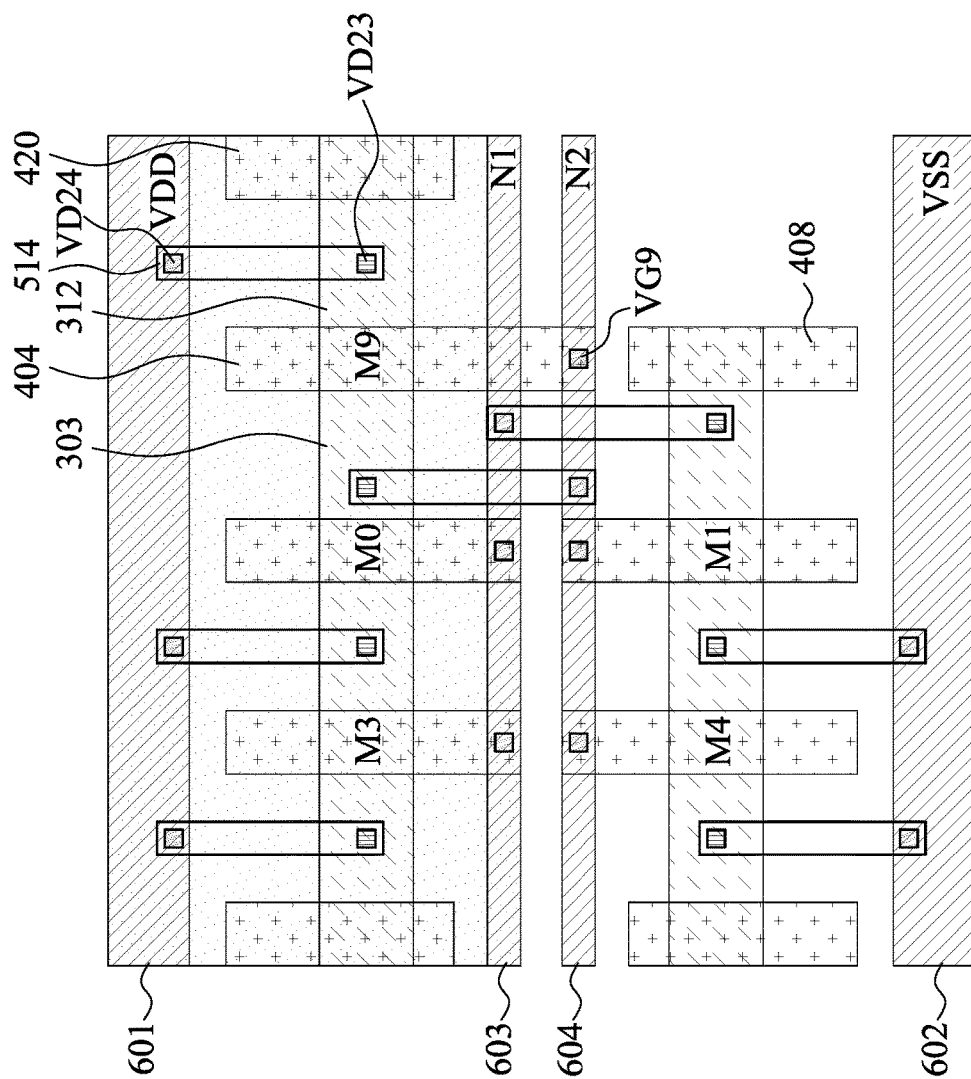
FIG. 8 is a layout diagram corresponding to the integrated circuit in FIG. 7, in accordance with some embodiments.

Reference is now made to FIG. 8. FIG. 8 is a layout diagram corresponding to the integrated circuit 40 in FIG. 7, in accordance with some embodiments. With respect to the embodiments of FIGS. 1A-7, like elements in FIG. 8 are designated with the same reference numbers for ease of understanding.

Compared with FIG. 3, instead of including relevant structures corresponding to the transistor M2, the integrated circuit 40 includes an active region 312, a gate 420, a conductive segment 514 and the vias VD23-VD24. The active region 312 is configured with respect to, for example, the active region 303. The gate 420 is configured with respect to, for example, the gate 413. In some embodiments, the gate 420 is a dummy gate. The conductive segment 514 is configured with respect to, for example, the conductive segment 502. The vias VD23-VD24 are configured with respect to, for example, the via VD4.

In some embodiments, the active region 303 corresponds to the gate of the transistor M0 and the drain of the transistor M9, the gate 404 corresponds to the gate of the transistor M9, and the active region 312 corresponds to the source of the transistor M9. The gate 404 is coupled to the conductive line 604 through the via VG9. The active region 312 is coupled to conductive segment 514 through the via VD23, and the conductive segment 514 is coupled to the conductive line 601 through the via VD24. Accordingly, the gate and the drain of the transistor M9 are coupled to the node N2, and the source of the transistor M9 is coupled to the supply voltage terminal VDD.

In some embodiments, a portion of the ESD current between the supply voltage terminal VDD and the supply voltage terminal VSS is discharged by the semiconductor structure of the transistors M0, M4, M9 and the conductive line 604. In various embodiments, another portion of the ESD current is discharged by the transistors M1, M3 and the conductive line 603.

The configurations of FIG. 8 are given for illustrative purposes. Various implements are within the contemplated scope of the present disclosure. For example, in some embodiments, the integrated circuit 40 in FIG. 8 includes structures of separated active regions.

Figure 9:
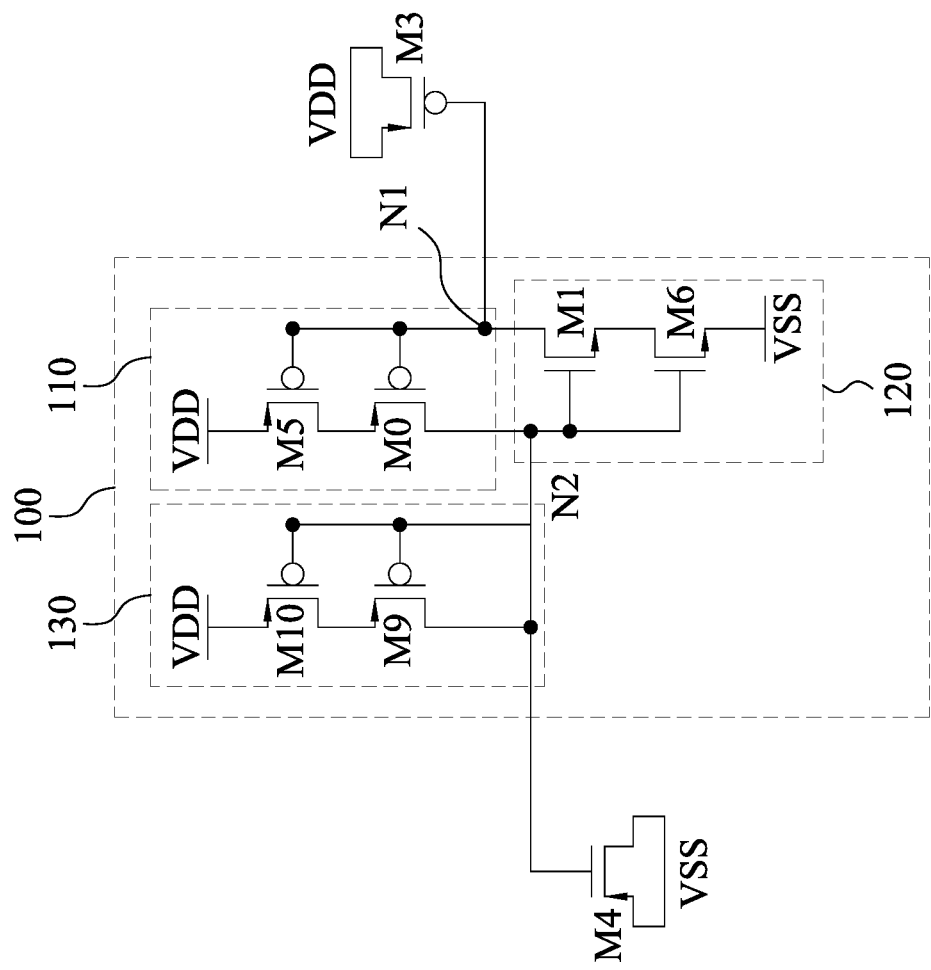
FIG. 9 is detailed schematic diagram of an integrated circuit corresponding to the integrated circuit in FIG. 1B, in accordance with various embodiments.

Reference is now made to FIG. 9. FIG. 9 is detailed schematic diagram of an integrated circuit corresponding to the integrated circuit in FIG. 1B, in accordance with various embodiments. With respect to the embodiments of FIGS. 1A-8, like elements in FIG. 9 are designated with the same reference numbers for ease of understanding.

Compared with FIG. 4, instead of the control circuit 130 including multiple N-type transistors, the control circuit 130 in FIG. 9 includes multiple P-type transistors M9-M10 that are coupled in series. A gate of the transistor M10 and a gate of the transistor M9 are coupled at the node N2, a source of the transistor M9 is coupled to a drain of the transistor M10, and a source of the transistor M10 is coupled to the supply voltage terminal VDD.

The configurations of FIG. 9 are given for illustrative purposes. Various implements are within the contemplated scope of the present disclosure. For example, in some embodiments, a number of multiple N-type transistors included in the voltage generation circuit 120 is greater than a sum of a number of P-type transistors included in the voltage generation circuit 110 and a number of P-type transistors included in the control circuit 130.

Figure 10A:
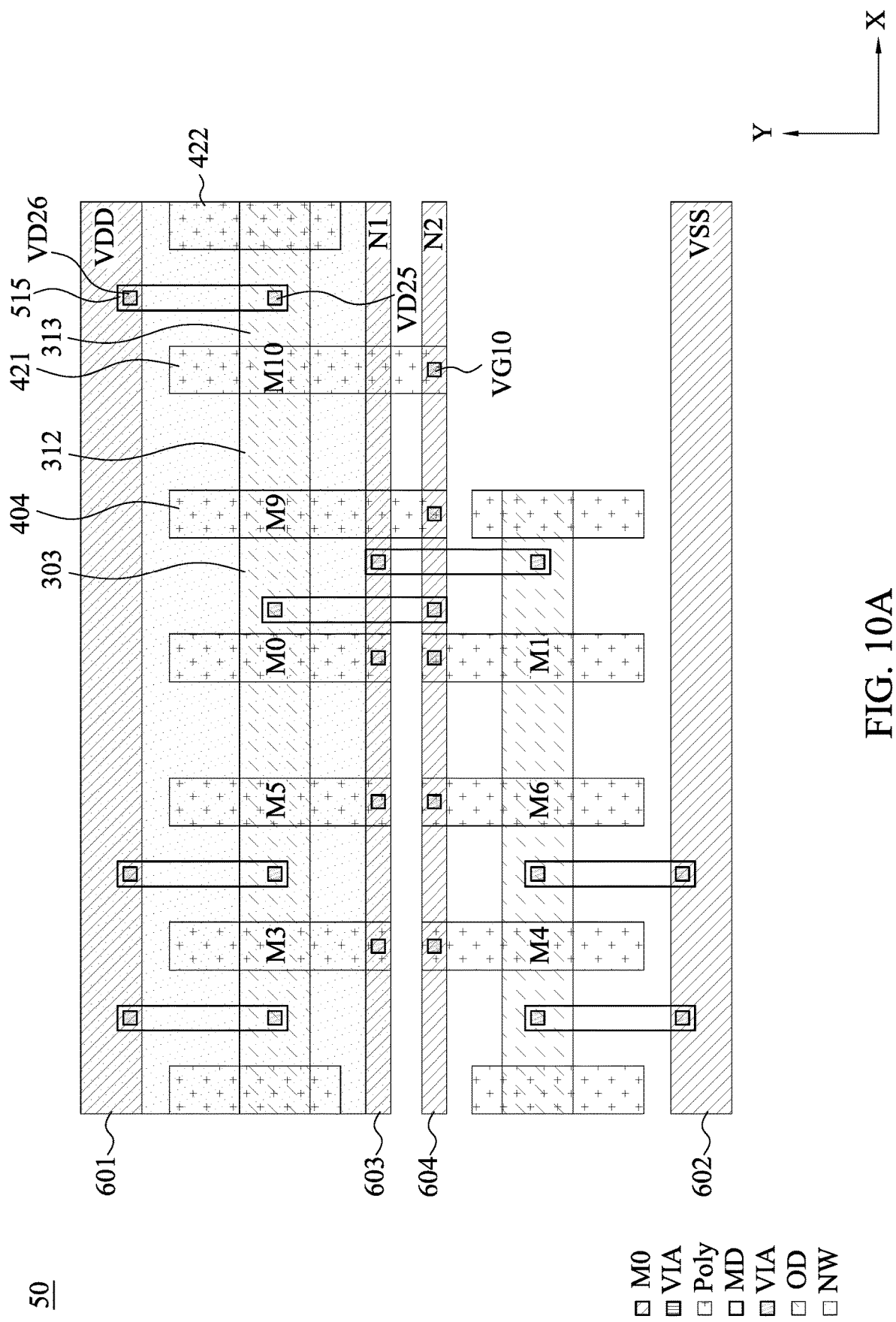
FIG. 10A is a layout diagram corresponding to the integrated circuit in FIG. 9, in accordance with some embodiments.

Reference is now made to FIG. 10A. FIG. 10A is a layout diagram corresponding to the integrated circuit 50 in FIG. 9, in accordance with some embodiments. With respect to the embodiments of FIGS. 1-9, like elements in FIG. 10A are designated with the same reference numbers for ease of understanding.

Compared with FIG. 5A, instead of including relevant structures corresponding to the transistors M2 and M7, the integrated circuit 50 includes an active region 313, gates 421-422, a conductive segment 515 and vias VD25-VD26. The active region 313 is configured with respect to, for example, the active region 312. The gates 421-422 are configured with respect to, for example, the gate 404. In some embodiments, the gate 422 is a dummy gate. The conductive segment 515 is configured with respect to, for example, the conductive segment 505. The vias VD25-VD26 are configured with respect to, for example, the via VD4. The via VG9 is configured with respect to, for example, the via VG8.

In some embodiments, the active region 313 corresponds to a source of the transistor M10, the gate 421 corresponds to a gate of the transistor M10, and the active region 312 corresponds to a drain of the transistor M10 and a source of the transistor M9. The gate 421 is coupled to the conductive line 604 through the via VG10. Accordingly, the gate of the transistor M10 is coupled to the node N2, the source of the transistor M10 is coupled to the supply voltage terminal VDD, and the drain of the transistor M10 is coupled to the source of the transistor M9.

Figure 10B:
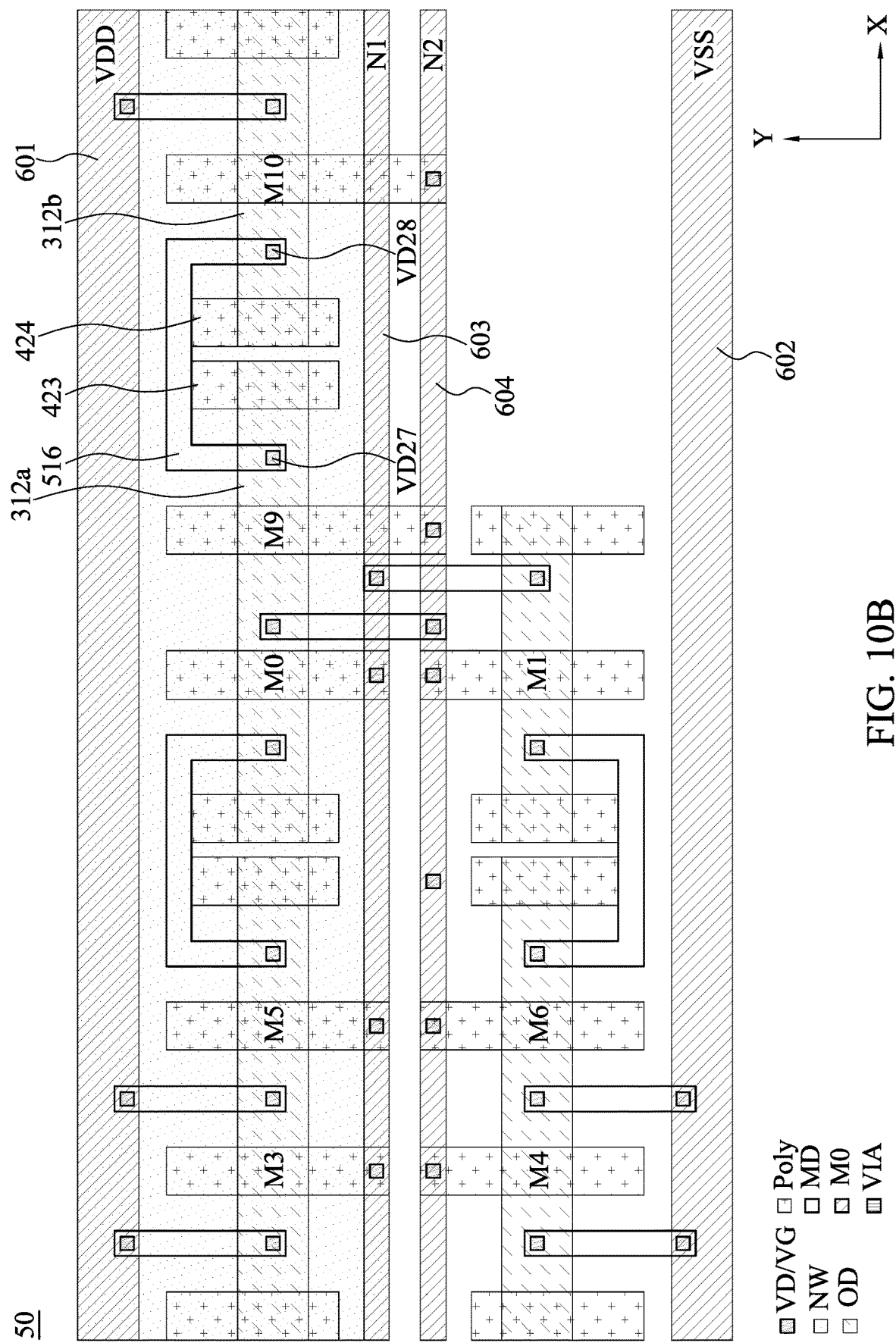
FIG. 10B is a layout diagram corresponding to the integrated circuit in FIG. 9, in accordance with various embodiments.

Reference is now made to FIG. 10B. FIG. 10B is a layout diagram corresponding to the integrated circuit 50 in FIG. 9, in accordance with various embodiments. With respect to the embodiments of FIGS. 1A-10A, like elements in FIG. 10B are designated with the same reference numbers for ease of understanding.

Compared with FIG. 10A, with regard to transistors sharing active regions, portions of the active areas included in the transistors in FIG. 10B are separated with each other. As shown in FIG. 10B, compared with FIG. 5B, the integrated circuit 50 further includes active regions 312a-312b, gates 423-424, a conductive segment 516 and vias VD27-28. In some embodiments, the active regions 312a-312b correspond to a first portion and a second portion of the active region 312 in FIG. 10A. The gates 423-424 are configured with respect to, for example, the gates 414-415. In some embodiments, the gates 423-424 are dummy gates. The conductive segment 516 is configured with respect to, for example, the conductive segment 512. The vias VD27-VD28 are configured with respect to, for example, the via VD17.

In some embodiments, the gates 423-424 are not electrically connected with the conductive segment 516.

In some embodiments, the active region 312a corresponds to the source of the transistor M9, and the active region 312b corresponds to the drain of the transistor M10. In addition, the active regions 312a-312b are separated from each other in x direction. Alternatively stated, the transistors M9 and M10 do not share active regions.

The configurations of FIGS. 10A-10B are given for illustrative purposes. Various implements are within the contemplated scope of the present disclosure. For example, in some embodiments, all of the active regions in the integrated circuit 50 have separated active region structure. In various embodiments, the transistors M9-M10 in the integrated circuit 50 include separated active region structure, and the transistors M0-M1 and M5-M6 include shared active region structure.

Figure 11:
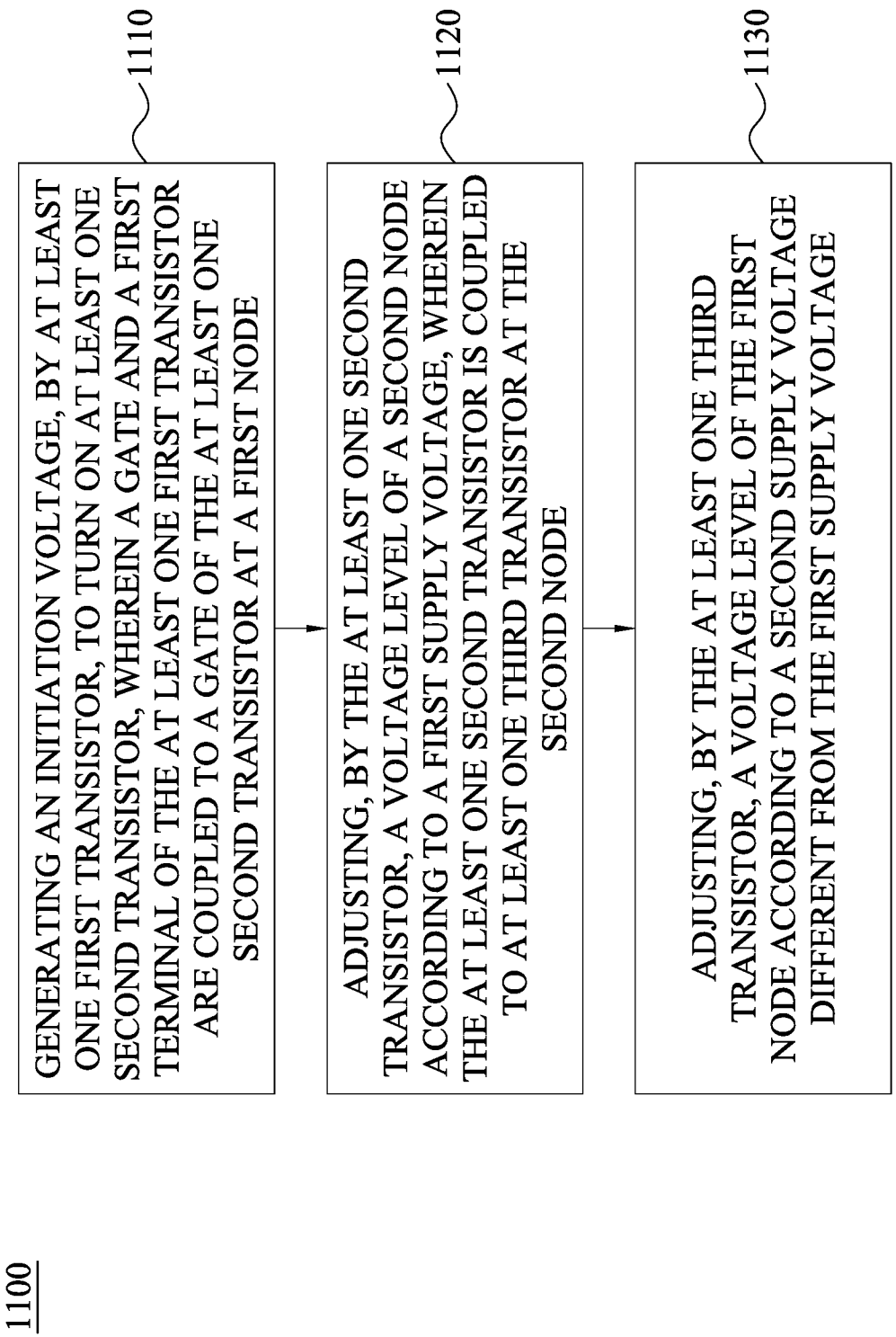
FIG. 11 is a flow chart of a method of operating an integrated circuit, in accordance with some embodiments.

Reference is now made to FIG. 11. FIG. 11 is a flow chart of a method 1100 of operating the integrated circuit 10, 20, 40 or 50, in accordance with some embodiments. It is understood that additional operations can be provided before, during, and after the processes shown by FIG. 11, and some of the operations described below can be replaced or eliminated, for additional embodiments of the method. The order of the operations/processes may be interchangeable. Throughout the various views and illustrative embodiments, like reference numbers are used to designate like elements. The method 1100 includes operations 1110-1130 that are described below with reference to the integrated circuit 10 in FIG. 2.

In operation 1110, as shown in FIG. 2, the transistor M2 generates the initiation voltage to turn on the transistor M0, in which the gate and the drain of transistor M2 are coupled to the gate of the transistor M0 at the node N1. As mentioned above, in some embodiments, the initiation voltage equals the threshold voltage of the transistor M2.

In operation 1120, as shown in FIG. 2, the transistor M0 adjusts the voltage level of the node N2 according to the supply voltage VDD. The transistor M0 is coupled to the transistor M1 at the node N2.

In some embodiments, adjusting the voltage level of the node N2 includes transmitting by the transistor M0 the supply voltage VDD to the node N2 to turn on the transistor M1.

In operation 1130, as shown in FIG. 2, the turned-on transistor M1 adjusts the voltage level of the node N1 according the supply voltage VSS different from the supply voltage VDD.

In some embodiments, adjusting the voltage level of the node N1 includes transmitting by the transistor M1 the supply voltage VSS to the node N1, and therefore, the voltage level of the node N1 is pulled down from the threshold voltage of the transistor M2 to the supply voltage VSS. In some embodiments, the supply voltage VSS is a ground voltage.

In some embodiments, the method 1100 further includes turning on, in response to the initiation voltage, the transistor M3, and therefore, the transistor M3 operates as the decoupling capacitive unit 200. The transistor M3 is coupled to the node N1.

In some embodiments, the method 1100 further includes directing the ESD current from the transistor M3, through the transistor M2 (i.e., through the electrostatic discharge path P1), to the supply voltage terminal VSS providing the supply voltage VSS.

Similarly, as the embodiments in FIG. 7, in operation 1110, the transistor M9 generates the initiation voltage to turn on the transistor M1, in which the gate and the drain of transistor M9 are coupled to the gate of the transistor M1 at the node N2. As mentioned above, in some embodiments, the initiation voltage equals the supply voltage VDD subtracted by the threshold voltage of the transistor M9.

In operation 1120, as shown in FIG. 7, the transistor M1 adjusts the voltage level of the node N1 according to the supply voltage VSS. The transistor M1 is coupled to the transistor M0 at the node N1.

In some embodiments, adjusting the voltage level of the node N1 includes transmitting by the transistor M1 the supply voltage VSS to the node N1 to turn on the transistor M0.

In operation 1130, as shown in FIG. 7, the turned-on transistor M0 adjusts the voltage level of the node N2 according the supply voltage VDD different from the supply voltage VSS.

In some embodiments, adjusting the voltage level of the node N2 includes transmitting by the transistor M0 the supply voltage VDD to the node N2, and therefore, the voltage level of the node N2 is pulled up to the supply voltage VDD.

In some embodiments, the method 1100 further includes turning on, in response to the initiation voltage, the transistor M4, and therefore, the transistor M4 operates as the decoupling capacitive unit 300. The transistor M4 is coupled to the node N2.

In some embodiments, the method 1100 further includes directing the ESD current from the transistor M4, through the transistor M9 (i.e., through the electrostatic discharge path P4), to the supply voltage terminal VDD providing the supply voltage VDD.

Figure 12:
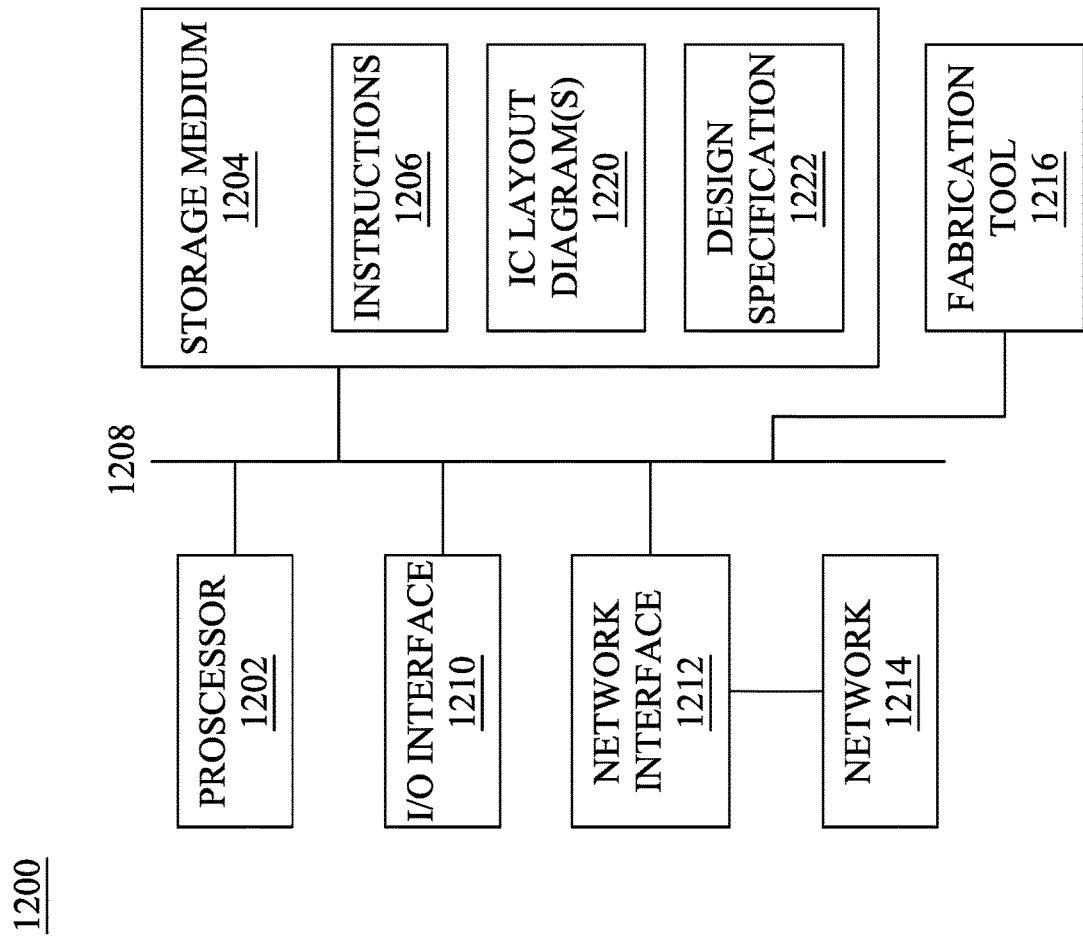
FIG. 12 is a block diagram of a system for designing the integrated circuit layout design, in accordance with some embodiments of the present disclosure.

Reference is now made to FIG. 12. FIG. 12 is a block diagram of an electronic design automation (EDA) system 1200 for designing the integrated circuit layout design, in accordance with some embodiments of the present disclosure. EDA system 1200 is configured to implement one or more operations of the method 1100 disclosed in FIG. 11, and further explained in conjunction with FIGS. 1A-10B. In some embodiments, EDA system 1200 includes an APR system.

In some embodiments, EDA system 1200 is a general purpose computing device including a hardware processor 1202 and a non-transitory, computer-readable storage medium 1204. Storage medium 1204, amongst other things, is encoded with, i.e., stores, computer program code (instructions) 1206, i.e., a set of executable instructions. Execution of instructions 1206 by hardware processor 1202 represents (at least in part) an EDA tool which implements a portion or all of, e.g., the method 1100.

The processor 1202 is electrically coupled to computer-readable storage medium 1204 via a bus 1208. The processor 1202 is also electrically coupled to an I/O interface 1210 and a fabrication tool 1216 by bus 1208. A network interface 1212 is also electrically connected to processor 1202 via bus 1208. Network interface 1212 is connected to a network 1214, so that processor 1202 and computer-readable storage medium 1204 are capable of connecting to external elements via network 1214. The processor 1202 is configured to execute computer program code 1206 encoded in computer-readable storage medium 1204 in order to cause EDA system 1200 to be usable for performing a portion or all of the noted processes and/or methods. In one or more embodiments, processor 1202 is a central processing unit (CPU), a multi-processor, a distributed processing system, an application specific integrated circuit (ASIC), and/or a suitable processing unit.

In one or more embodiments, computer-readable storage medium 1204 is an electronic, magnetic, optical, electromagnetic, infrared, and/or a semiconductor system (or apparatus or device). For example, computer-readable storage medium 1204 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1204 includes a compact disk-read only memory (CD-ROM), a compact disk-read/write (CD-R/W), and/or a digital video disc (DVD).

In one or more embodiments, storage medium 1204 stores computer program code 1206 configured to cause EDA system 1200 (where such execution represents (at least in part) the EDA tool) to be usable for performing a portion or all of the noted processes and/or methods. In one or more embodiments, storage medium 1204 also stores information which facilitates performing a portion or all of the noted processes and/or methods. In one or more embodiments, storage medium 1204 stores IC layout diagram 1220 of standard cells including such standard cells as disclosed herein, for example, a cell including in the integrated circuits 10, 20, 40 and/or 50 discussed above with respect to FIGS. 1A-10B.

EDA system 1200 includes I/O interface 1210. I/O interface 1210 is coupled to external circuitry. In one or more embodiments, I/O interface 1210 includes a keyboard, keypad, mouse, trackball, trackpad, touchscreen, and/or cursor direction keys for communicating information and commands to processor 1202.

EDA system 1200 also includes network interface 1212 coupled to processor 1202. Network interface 1212 allows EDA system 1200 to communicate with network 1214, to which one or more other computer systems are connected. Network interface 1212 includes wireless network interfaces such as BLUETOOTH, WIFI, WIMAX, GPRS, or WCDMA; or wired network interfaces such as ETHERNET, USB, or IEEE-1264. In one or more embodiments, a portion or all of noted processes and/or methods, is implemented in two or more systems 1200.

EDA system 1200 also includes the fabrication tool 1216 coupled to processor 1202. The fabrication tool 1216 is configured to fabricate integrated circuits, e.g., the integrated circuits 10, 20, and 40-50 illustrated in FIGS. 1A-10B, according to the design files processed by the processor 1202.

EDA system 1200 is configured to receive information through I/O interface 1210. The information received through I/O interface 1210 includes one or more of instructions, data, design rules, libraries of standard cells, and/or other parameters for processing by processor 1202. The information is transferred to processor 1202 via bus 1208. EDA system 1200 is configured to receive information related to a UI through I/O interface 1210. The information is stored in computer-readable medium 1204 as design specification 1222.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1200. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 13:
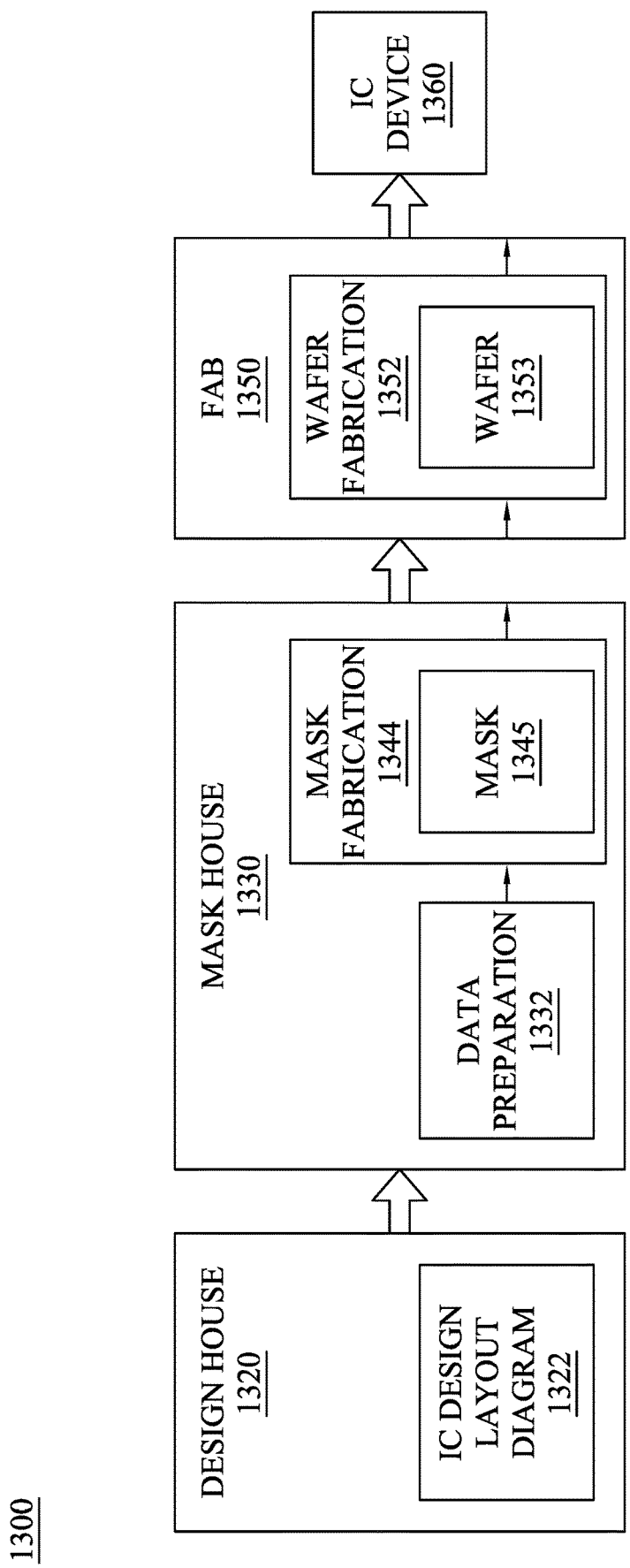
FIG. 13 is a block diagram of an integrated circuit manufacturing system, and an integrated circuit manufacturing flow associated therewith, in accordance with some embodiments.

FIG. 13 is a block diagram of IC manufacturing system 1300, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1300.

In FIG. 13, IC manufacturing system 1300 includes entities, such as a design house 1320, a mask house 1330, and an IC manufacturer/fabricator ("fab") 1350, that interact with one another in the design, development, and manufacturing cycles and/or services related to manufacturing an IC device 1360. The entities in IC manufacturing system 1300 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1320, mask house 1330, and IC fab 1350 is owned by a single larger company. In some embodiments, two or more of design house 1320, mask house 1330, and IC fab 1350 coexist in a common facility and use common resources.

Design house (or design team) 1320 generates an IC design layout diagram 1322. IC design layout diagram 1322 includes various geometrical patterns, for example, an IC layout design depicted in FIGS. 3, 5A-5B, 8, and 10A-10B, designed for an IC device 1360, for example, integrated circuits 10, 20, 40, and 50 discussed above with respect to FIGS. 1A-10B. The geometrical patterns correspond to patterns of metal, oxide, or semiconductor layers that make up the various components of IC device 1360 to be fabricated. The various layers combine to form various IC features. For example, a portion of IC design layout diagram 1322 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 1320 implements a proper design procedure to form IC design layout diagram 1322. The design procedure includes one or more of logic design, physical design or place and route. IC design layout diagram 1322 is presented in one or more data files having information of the geometrical patterns. For example, IC design layout diagram 1322 can be expressed in a GDSII file format or DFII file format.

Mask house 1330 includes data preparation 1332 and mask fabrication 1344. Mask house 1330 uses IC design layout diagram 1322 to manufacture one or more masks 1345 to be used for fabricating the various layers of IC device 1360 according to IC design layout diagram 1322. Mask house 1330 performs mask data preparation 1332, where IC design layout diagram 1322 is translated into a representative data file ("RDF"). Mask data preparation 1332 provides the RDF to mask fabrication 1344. Mask fabrication 1344 includes a mask writer. A mask writer converts the RDF to an image on a substrate, such as a mask (reticle) 1345 or a semiconductor wafer 1353. The IC design layout diagram 1322 is manipulated by mask data preparation 1332 to comply with particular characteristics of the mask writer and/or requirements of IC fab 1350. In FIG. 13, data preparation 1332 and mask fabrication 1344 are illustrated as separate elements. In some embodiments, data preparation 1332 and mask fabrication 1344 can be collectively referred to as mask data preparation.

In some embodiments, data preparation 1332 includes optical proximity correction (OPC) which uses lithography enhancement techniques to compensate for image errors, such as those that can arise from diffraction, interference, other process effects and the like. OPC adjusts IC design layout diagram 1322. In some embodiments, data preparation 1332 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 1332 includes a mask rule checker (MRC) that checks the IC design layout diagram 1322 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1322 to compensate for limitations during mask fabrication 1344, which may undo part of the modifications performed by OPC in order to meet mask creation rules.

In some embodiments, data preparation 1332 includes lithography process checking (LPC) that simulates processing that will be implemented by IC fab 1350 to fabricate IC device 1360. LPC simulates this processing based on IC design layout diagram 1322 to create a simulated manufactured device, such as IC device 1360. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1322.

It should be understood that the above description of data preparation 1332 has been simplified for the purposes of clarity. In some embodiments, data preparation 1332 includes additional features such as a logic operation (LOP) to modify the IC design layout diagram 1322 according to manufacturing rules. Additionally, the processes applied to IC design layout diagram 1322 during data preparation 1332 may be executed in a variety of different orders.

After data preparation 1332 and during mask fabrication 1344, a mask 1345 or a group of masks 1345 are fabricated based on the modified IC design layout diagram 1322. In some embodiments, mask fabrication 1344 includes performing one or more lithographic exposures based on IC design layout diagram 1322. In some embodiments, an electron-beam (e-beam) or a mechanism of multiple e-beams is used to form a pattern on a mask (photomask or reticle) 1345 based on the modified IC design layout diagram 1322. Mask 1345 can be formed in various technologies. In some embodiments, mask 1345 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 1345 includes a transparent substrate (for example, fused quartz) and an opaque material (for example, chromium) coated in the opaque regions of the binary mask. In another example, mask 1345 is formed using a phase shift technology. In a phase shift mask (PSM) version of mask 1345, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1344 is used in a variety of processes. For example, such a mask(s) is used in an ion implantation process to form various doped regions in semiconductor wafer 1353, in an etching process to form various etching regions in semiconductor wafer 1353, and/or in other suitable processes.

IC fab 1350 includes wafer fabrication 1352. IC fab 1350 is an IC fabrication business that includes one or more manufacturing facilities for the fabrication of a variety of different IC products. In some embodiments, IC Fab 1350 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1350 uses mask(s) 1345 fabricated by mask house 1330 to fabricate IC device 1360. Thus, IC fab 1350 at least indirectly uses IC design layout diagram 1322 to fabricate IC device 1360. In some embodiments, semiconductor wafer 1353 is fabricated by IC fab 1350 using mask(s) 1345 to form IC device 1360. In some embodiments, the IC fabrication includes performing one or more lithographic exposures based at least indirectly on IC design layout diagram 1322. Semiconductor wafer 1353 includes a silicon substrate or other proper substrate having material layers formed thereon. Semiconductor wafer 1353 further includes one or more of various doped regions, dielectric features, multi-level interconnects, and the like (formed at subsequent manufacturing steps).

As described above, the integrated circuit of the present disclosure includes a start-up circuit arranged between the two terminals of electrostatic discharge path to increase the ability of the integrated circuit for electrostatic charge dissipation. In addition, the integrated circuit also includes a control circuit that provides the initiation voltage to the start-up circuit, so that the pull-down circuit or the pull-up circuit included in the start-up circuit can act quickly in response to the initiation voltage; thereby the operation speed of the start-up circuit is improved. Furthermore, with the configuration of the present disclosure, P-type and N-type transistors utilized as capacitor units in the integrated circuit provide high decoupling capacitance values with a small area.

In some embodiments, an integrated circuit includes a control circuit, a first voltage generation circuit, and a second voltage generation circuit. The control circuit is coupled between a first voltage terminal and a first node, and generates an initiation voltage at the first node. The first voltage generation circuit and the second voltage generation circuit are coupled to a first capacitive unit at the first node and coupled to a second capacitive unit at a second node. The first voltage generation circuit generates, in response to the initiation voltage at the first node, a first control signal based on a first supply voltage from a second voltage terminal to the second voltage generation circuit. The second voltage generation circuit generates, in response to the first control signal received from the first voltage generation circuit, a second control signal to the first node, based on a second supply voltage, different from the first supply voltage, from the first voltage terminal. In some embodiments, the control circuit includes a transistor having a source coupled to the second voltage terminal and a drain and a gate that are coupled to the first node. In some embodiments, the initiation voltage generated by the control circuit is associated with a threshold voltage of the transistor and the first supply voltage. In some embodiments, the first capacitive unit is coupled between the first node and the second voltage terminal, and the control circuit and the first capacitive unit are configured as an electrostatic discharge path between the first voltage terminal and the second voltage terminal. In some embodiments, the first control signal is associated with a voltage level of the second node, and the second control signal is associated with a voltage level of the first node. In some embodiments, the first voltage generation circuit includes a P-type transistor having a gate coupled to the first node and a drain coupled to the second node. The second voltage generation circuit includes a N-type transistor having a gate coupled to the second node and a drain coupled to the first node. In some embodiments, the first voltage generation circuit includes multiple first transistors coupled in series with each other and the second voltage generation circuit includes multiple second transistors coupled in series with each other. The control circuit includes multiple third transistors coupled in series with each other. A number of the first transistors is different than a sum of a number of the second transistors and a number of the third transistors. In some embodiments, the first transistors are P-type, and the second transistors and the third transistors are N-type. The number of the first transistors is smaller than the sum of the number of the second transistors and the number of the third transistors. In some embodiments, the control circuit includes a transistor having a source coupled to the first voltage terminal and a drain and a gate that are coupled to the first node. When the first voltage terminal is a ground terminal, the initiation voltage equals to a threshold voltage of the transistor. The second voltage generation circuit pulls down a voltage of the first node to a ground voltage of the ground terminal. In some embodiments, the second voltage generation circuit includes a transistor having a first terminal coupled to the first node, a second terminal coupled to the first voltage terminal, and a control terminal coupled to the second node. The second voltage generation circuit and the first capacitive unit are as an electrostatic discharge path to direct an electrostatic discharge current from the first voltage terminal, through the first capacitive unit, and the first terminal and the second terminal of the transistor, to the second voltage terminal.

Also disclosed is an integrated circuit that includes a first conductive line and a second conductive line that extend in a first direction, a first gate, a second gate and a third active region, and a third gate. The first gate is coupled to the first conductive line and arranged between a first active region and a second active region that are coupled to a first voltage terminal. The second gate and the third active region are coupled to the first conductive line. The second gate is arranged between the third active region and a fourth active region coupled to a second voltage terminal. The third gate is separated from the second gate in the first direction, coupled to the second conductive line, and arranged between the third active region and a fifth active region coupled to the second voltage terminal. The first gate, the first active region and second active region are included in a structure operating as a first transistor. The second gate, the third active region and fourth active region are included in a structure operating as a second transistor. The third gate, the third active region and fifth fourth active region are included in a structure operating as a third transistor. The first to third transistors and the first conductive line discharge a first portion of an electrostatic discharge current between the first voltage terminal and the second voltage terminal. In some embodiments, the first conductive line and the second conductive line are arranged between the first active region and the fifth active region. In some embodiments, the integrated circuit further includes a fourth gate and a fifth gate. The fourth gate is coupled to the first conductive line and arranged between the first active region and a sixth active region coupled to the second conductive line. The fourth gate, the fifth active region, and the sixth active region are included in a structure operating as a fourth transistor. The fifth gate is coupled to the second conductive line and arranged between the fifth active region and a seventh active region coupled to the second voltage terminal. When the fourth transistor is turned on in response to a voltage generated by the second transistor to the first conductive line, the fourth transistor, the second conductive line, the fifth gate, and the fifth and seventh active regions are configured to discharge a second portion of the electrostatic discharge current between the first voltage terminal or the second voltage terminal. In some embodiments, the integrated circuit further includes a fourth gate which is separated from the second gate in the first direction and coupled to the first conductive line. The fourth gate is included in a structure operating as a fourth transistor. The second transistor and the fourth transistor are coupled in series between the first conductive line and the second voltage terminal. In some embodiments, the integrated circuit further includes a sixth active region and a seventh active region coupled to the sixth active region. The sixth active region is included in a structure corresponding to a source of the second transistor, and the seventh active region is included in a structure corresponding to a drain of the fourth transistor. The sixth active region and the seventh active region are separated with each other in the first direction.

Also disclosed is a method that includes the operation below: generating an initiation voltage, by at least one first transistor, to turn on at least one second transistor, in which a gate and a first terminal of the at least one first transistor are coupled to a gate of the at least one second transistor at a first node; adjusting, by the at least one second transistor, a voltage level of a second node according to a first supply voltage, in which the at least one second transistor is coupled to at least one third transistor at the second node; and adjusting, by the at least one third transistor, a voltage level of the first node according to a second supply voltage different from the first supply voltage. In some embodiments, adjusting the voltage level of the second node includes transmitting, by the at least one second transistor, the first supply voltage to the second node to turn on the at least one third transistor. In some embodiments, adjusting the voltage level of the first node includes pulling down the voltage level of the first node from a threshold voltage of the at least one first transistor to the second supply voltage. In some embodiments, the method further includes turning on, in response to the initiation voltage, a fourth transistor operating as a decoupling capacitive unit, wherein a gate of the fourth transistor is coupled to the first node. In some embodiments, the method further includes directing an electrostatic discharge current flowing from the fourth transistor, through the at least one first transistor, to a voltage terminal providing the second supply voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a control circuit coupled between a first voltage terminal and a first node, and configured to generate an initiation voltage at the first node; and
   a first voltage generation circuit and a second voltage generation circuit that are coupled to a first capacitive unit at the first node and coupled to a second capacitive unit at a second node,
   wherein the first voltage generation circuit is configured to generate, in response to the initiation voltage at the first node, a first control signal based on a first supply voltage from a second voltage terminal to the second voltage generation circuit, wherein the first voltage generation circuit comprises a plurality of first transistors coupled in series with each other between the second node and the second voltage terminal, and
   the second voltage generation circuit is configured to generate, in response to the first control signal received from the first voltage generation circuit, a second control signal to the first node, based on a second supply voltage, different from the first supply voltage, from the first voltage terminal.

2. The integrated circuit of claim 1, wherein the control circuit comprises:
   a transistor having a source coupled to the second voltage terminal and a drain and a gate that are coupled to the first node.

3. The integrated circuit of claim 2, wherein the initiation voltage generated by the control circuit is associated with a threshold voltage of the transistor and the first supply voltage.

4. The integrated circuit of claim 1, wherein the first capacitive unit is coupled between the first node and the second voltage terminal, and the control circuit and the first capacitive unit are configured as an electrostatic discharge path between the first voltage terminal and the second voltage terminal.

5. The integrated circuit of claim 1, wherein the first control signal is associated with a voltage level of the second node, and the second control signal is associated with a voltage level of the first node.

6. The integrated circuit of claim 1, wherein
   the second voltage generation circuit comprises a N-type transistor having a gate coupled to the second node and a drain coupled to the first node.

7. The integrated circuit of claim 1, wherein the second voltage generation circuit comprises a plurality of second transistors coupled in series with each other,
   wherein the control circuit comprises a plurality of third transistors coupled in series with each other;
   wherein a number of the plurality of first transistors is different than a sum of a number of the plurality of second transistors and a number of the plurality of third transistors.

8. The integrated circuit of claim 7, wherein the plurality of first transistors are P-type, and the plurality of second transistors and the plurality of third transistors are N-type;
   wherein the number of the plurality of first transistors is smaller than the sum of the number of the plurality of second transistors and the number of the plurality of third transistors.

9. The integrated circuit of claim 1, wherein the control circuit comprises:
   a transistor having a source coupled to the first voltage terminal and a drain and a gate that are coupled to the first node, wherein when the first voltage terminal is a ground terminal, the initiation voltage equals to a threshold voltage of the transistor;
   wherein the second voltage generation circuit is configured to pull down a voltage of the first node to a ground voltage of the ground terminal.

10. The integrated circuit of claim 1, wherein the second voltage generation circuit comprises:
    a transistor having a first terminal coupled to the first node, a second terminal coupled to the first voltage terminal, and a control terminal coupled to the second node;
    wherein the second voltage generation circuit and the first capacitive unit are configured as an electrostatic discharge path to direct an electrostatic discharge current from the first voltage terminal, through the first capacitive unit, and the first terminal and the second terminal of the transistor, to the second voltage terminal.

11. An integrated circuit, comprising:
    a first conductive line and a second conductive line that extend in a first direction;
    a first gate coupled to the first conductive line and arranged between a first active region and a second active region that are coupled to a first voltage terminal;
    a second gate and a third active region that are coupled to the first conductive line, wherein the second gate is arranged between the third active region and a fourth active region coupled to a second voltage terminal; and
    a third gate which is separated from the second gate in the first direction, coupled to the second conductive line, and arranged between the third active region and a fifth active region coupled to the second voltage terminal;
    wherein the first gate, the first active region and second active region are included in a structure operating as a first transistor, wherein the second gate, the third active region and fourth active region are included in a structure operating as a second transistor, wherein the third gate, the third active region and fifth fourth active region are included in a structure operating as a third transistor;
    wherein the first to third transistors and the first conductive line are configured to discharge a first portion of an electrostatic discharge current between the first voltage terminal and the second voltage terminal.

12. The integrated circuit of claim 11, wherein the first conductive line and the second conductive line are arranged between the first active region and the fifth active region.

13. The integrated circuit of claim 11, further comprising:
    a fourth gate coupled to the first conductive line and arranged between the first active region and a sixth active region coupled to the second conductive line, wherein the fourth gate, the fifth active region, and the sixth active region are included in a structure operating as a fourth transistor; and a fifth gate coupled to the second conductive line and arranged between the fifth active region and a seventh active region coupled to the second voltage terminal;

wherein when the fourth transistor is turned on in response to a voltage generated by the second transistor to the first conductive line, the fourth transistor, the second conductive line, the fifth gate, and the fifth and seventh active regions are configured to discharge a second portion of the electrostatic discharge current between the first voltage terminal or the second voltage terminal.

14. The integrated circuit of claim 11, further comprising:

a fourth gate which is separated from the second gate in the first direction and coupled to the first conductive line, wherein the fourth gate is included in a structure operating as a fourth transistor;

wherein the second transistor and the fourth transistor are coupled in series between the first conductive line and the second voltage terminal.

15. The integrated circuit of claim 14, further comprising:

a sixth active region and a seventh active region coupled to the sixth active region;

wherein the sixth active region is included in a structure corresponding to a source of the second transistor, and the seventh active region is included in a structure corresponding to a drain of the fourth transistor;

wherein the sixth active region and the seventh active region are separated with each other in the first direction.

16. A method, comprising:

generating an initiation voltage, by a plurality of first transistors that are coupled in series, to turn on at least one second transistor, wherein gate and first terminals of the plurality of first transistors are coupled to a gate of the at least one second transistor at a first node;

adjusting, by the at least one second transistor, a voltage level of a second node according to a first supply voltage, wherein the at least one second transistor is coupled to at least one third transistor at the second node; and adjusting, by the at least one third transistor, a voltage level of the first node according to a second supply voltage different from the first supply voltage.

17. The method of claim 16, wherein adjusting the voltage level of the second node comprises:

transmitting, by the at least one second transistor, the first supply voltage to the second node to turn on the at least one third transistor.

18. The method of claim 16, wherein adjusting the voltage level of the first node comprises:

pulling down the voltage level of the first node from a threshold voltage of the plurality of first transistors to the second supply voltage.

19. The method of claim 16, further comprising:

turning on, in response to the initiation voltage, a fourth transistor operating as a decoupling capacitive unit, wherein a gate of the fourth transistor is coupled to the first node.

20. The method of claim 19, further comprising:

directing an electrostatic discharge current flowing from the fourth transistor, through the plurality of first transistors, to a voltage terminal providing the second supply voltage.

* * * * *